United States Patent
Portmann

(10) Patent No.: US 8,471,570 B2
(45) Date of Patent: Jun. 25, 2013

(54) DEVICE FOR QUANTIFYING AN ELECTRIC UNBALANCE AND TOUCH DETECTION SYSTEM INCORPORATING IT

(75) Inventor: Lionel Portmann, Lausanne (CH)

(73) Assignee: Pixcir Microelectronics Co., Ltd., Suzhou (CN)

( * ) Notice: Subject to any disclaimer, the term of this patent is extended or adjusted under 35 U.S.C. 154(b) by 335 days.

(21) Appl. No.: 12/863,173

(22) PCT Filed: Jan. 14, 2009

(86) PCT No.: PCT/IB2009/000046
§ 371 (c)(1),
(2), (4) Date: Jul. 15, 2010

(87) PCT Pub. No.: WO2009/090534
PCT Pub. Date: Jul. 23, 2009

(65) Prior Publication Data
US 2010/0315102 A1    Dec. 16, 2010

(30) Foreign Application Priority Data
Jan. 15, 2008    (EP) .................................... 08000639

(51) Int. Cl.
*G01R 27/26* (2006.01)
(52) U.S. Cl.
USPC ........... 324/662; 324/658; 345/173; 345/174; 178/18.06; 178/19.03
(58) Field of Classification Search
USPC ........ 324/661, 662; 345/173, 174; 178/18.06, 178/19.03
See application file for complete search history.

(56) References Cited

U.S. PATENT DOCUMENTS

| 8,086,417 | B2 * | 12/2011 | Seguine ........................ 702/105 |
| 2002/0039092 | A1 | 4/2002 | Shigetaka | |
| 2005/0122119 | A1 * | 6/2005 | Barlow .......................... 324/662 |
| 2007/0268272 | A1 * | 11/2007 | Perski et al. .................. 345/173 |

FOREIGN PATENT DOCUMENTS

| EP | 1347263 A1 | 9/2003 |
| WO | 9618179 | 6/1996 |
| WO | 2006/133593 A1 | 12/2006 |
| WO | 2007135663 A1 | 11/2007 |

OTHER PUBLICATIONS

European Search Report, EP 08000639, dated Jun. 25, 2008.
International Search Report, PCT/IB2009/000046, dated Mar. 16, 2010.

* cited by examiner

*Primary Examiner* — Melissa Koval
*Assistant Examiner* — Feba Pothen
(74) *Attorney, Agent, or Firm* — Nixon Peabody LLP

(57) ABSTRACT

A device for detecting and quantifying an unbalance between first and second electric paths (R, S; S, VPS), particularly for a touch detection system, comprises: (a) comparison means (CC; CD) receiving at respective inputs the first and second paths; (b) variable transfer capacitance means (CPB; CPC) connected to at least one of the paths; and (c) a control unit (UC) connected between the comparison means and the variable transfer capacitance means and adapted to vary the variable transfer capacitance of said variable transfer capacitance means as a function of the result (Q) produced by the comparison means up to compensation of the unbalance.

25 Claims, 17 Drawing Sheets

DEVICE FOR QUANTIFYING AN ELECTRIC UNBALANCE AND TOUCH DETECTION SYSTEM INCORPORATING IT

CROSS-REFERENCE TO RELATED APPLICATIONS

This application is a national phase of International Application No. PCT/IB2009/000046, entitled "DEVICE FOR QUANTIFYING AN ELECTRIC UNBALANCE AND TOUCH DETECTION SYSTEM INCORPORATING IT" which was filed on Jan. 14, 2009, and which claims priority of European Patent Application No. 08000639.8, filed Jan. 15, 2008.

STATEMENT REGARDING FEDERALLY SPONSORED RESEARCH OR DEVELOPMENT

Not Applicable

NAMES OF THE PARTIES TO A JOINT RESEARCH AGREEMENT

Not Applicable

INCORPORATION-BY-REFERENCE OF MATERIAL SUBMITTED ON A COMPACT DISC

Not Applicable

BACKGROUND

The present invention relates to a device for detecting and quantifying an unbalance between electric paths, particularly for a touch detection system.

The present invention thus relates in particular to the field of devices known under the common term of touchpad, i.e., devices for the detection of a touch or the presence of a body, notably a tactile approach to a surface that may consist of a pad, i.e., a tablet or support for tactile imprint that under its surface has a series of conducting contact pieces arranged into various regular patterns (line, array, diamond-shaped pattern, honeycomb, spiral turns, maze, etc.) or may consist of a screen, which belongs to the allied field of touchscreens, that is, screens including devices that are sensitive to the approach of a finger or of an object such as a pen or more generally a condensed body.

There are known devices for the acquisition or recognition of tactile imprint that are based on electric and notably capacitive measuring principles, as well as detectors functioning by capacitive detection or switches functioning by proximity detection that also use capacitive detection, and hence are considered to be based on electrostatic principles.

In general, the detection principle of such devices is based on the implantation of large contact pieces or tracks on the two sides of a printed circuit, which sides form face-to-face conducting surfaces and therefore, from an electrostatic point of view, the two adjacent plates of a plane capacitor separated by a dielectric constituting the support of the printed circuit. When a finger approaches this surface, it perturbs the electric field and may for this reason be detected by adequate electronic circuits existing in many forms and variants.

One of the essential problems of this kind of devices is their sensitivity to electromagnetic perturbations, all the more as the absolute values of capacitance of these capacitors are generally very small (typically of the order of picofarad, such as 1 pF), and thus highly delicate to measure electronically, since they are readily perturbed by parasitic capacitances that are part of the measuring circuits, and by electromagnetic perturbations. This holds all the more as the proximity of a finger to the capacitor contact pieces of a touchpad will not substantially modify its value of capacitance. As a numerical illustration, the touch by a finger or presence of a body behind the capacitor plates of a plane capacitor with a capacitance of the order of 1 picofarad will modify its value by only 10%, which brings its capacitance to 0.9 pF or 1.1 pF. It is particularly delicate to measure electronically a capacitance variation of 0.1 pF (or 100 fF), and the tactile detection devices are known to be particularly capricious and uncertain with respect to the detection of a touch or tactile contact.

These devices have the disadvantage that the tactile approach behind the capacitor plates of a plane capacitor constituted by two conducting contact pieces on the two faces of a support will in fact induce a very slight variation in the value of capacitance, namely a variation that is slight with respect to the total value of capacitance, since the capacitance is little affected by modifications of the medium outside the interval separating the two capacitor plates, and that is slight in the absolute, since the values of capacitance between two thin conducting tracks with dimensions distinctly inferior to those of a finger will themselves amount to small absolute values.

A solution available to make a touch detection device less sensitive to the electromagnetic environment consists in detecting in a differential way the balance between first and second electric paths that are linked to the conductors or electrodes of the touch surface. Circuits capable of making such a differential detection are described in the documents WO 96/18179 and US 2002/0039092. They comprise an amplifier which receives the electrical paths at its inputs and which outputs a signal proportional to the difference of potential between these paths. The output signal must be treated analogically and then digitized in order to allow the electric unbalance to be quantified. These circuits are relatively difficult to realize, are sensitive to the environment (stability of the supply voltage, temperature, etc.), and generate noise.

BRIEF DESCRIPTION

The present invention aims at proposing a device for detecting and quantifying an unbalance between electrical paths, which remedies the disadvantages of prior approaches as described above.

To this end there is provided a device for detecting and quantifying an unbalance between first and second electrical paths, comprising:
- comparison means receiving at respective inputs the first and second paths,
- variable transfer capacitance means connected to at least one of the paths,
- a control unit connected between the comparison means and the variable transfer capacitance means and adapted to vary the variable transfer capacitance of said variable transfer capacitance means as a function of the result produced by the comparison means until the unbalance is compensated.

Such a device is simple to realize. The comparison means can be a simple comparator producing a state bit at its output. The variable transfer capacitance means can be constituted of simple capacitors associated with switches. These components generate little noise, are little sensitive to the environment, and consume little energy.

Particular embodiments of this device are defined in the annexed claims.

The present invention also proposes various embodiments of a system for detecting and locating a tactile approach or the presence of a body close to a surface, comprising the detection and quantification device defined hereinabove. These different embodiments are defined in the annexed claims.

Other characteristics, aims and advantages of the present invention will become apparent in the description of embodiments given in detail hereinbelow and in consideration of the annexed figures provided as nonlimiting examples.

BRIEF DESCRIPTION OF THE DRAWINGS

In the annexed drawings, we have:

FIGS. 10B and 10C show the effects of a tactile touch to the left and right of track S;

DETAILED DESCRIPTION OF THE INVENTIONS

Figure 1:
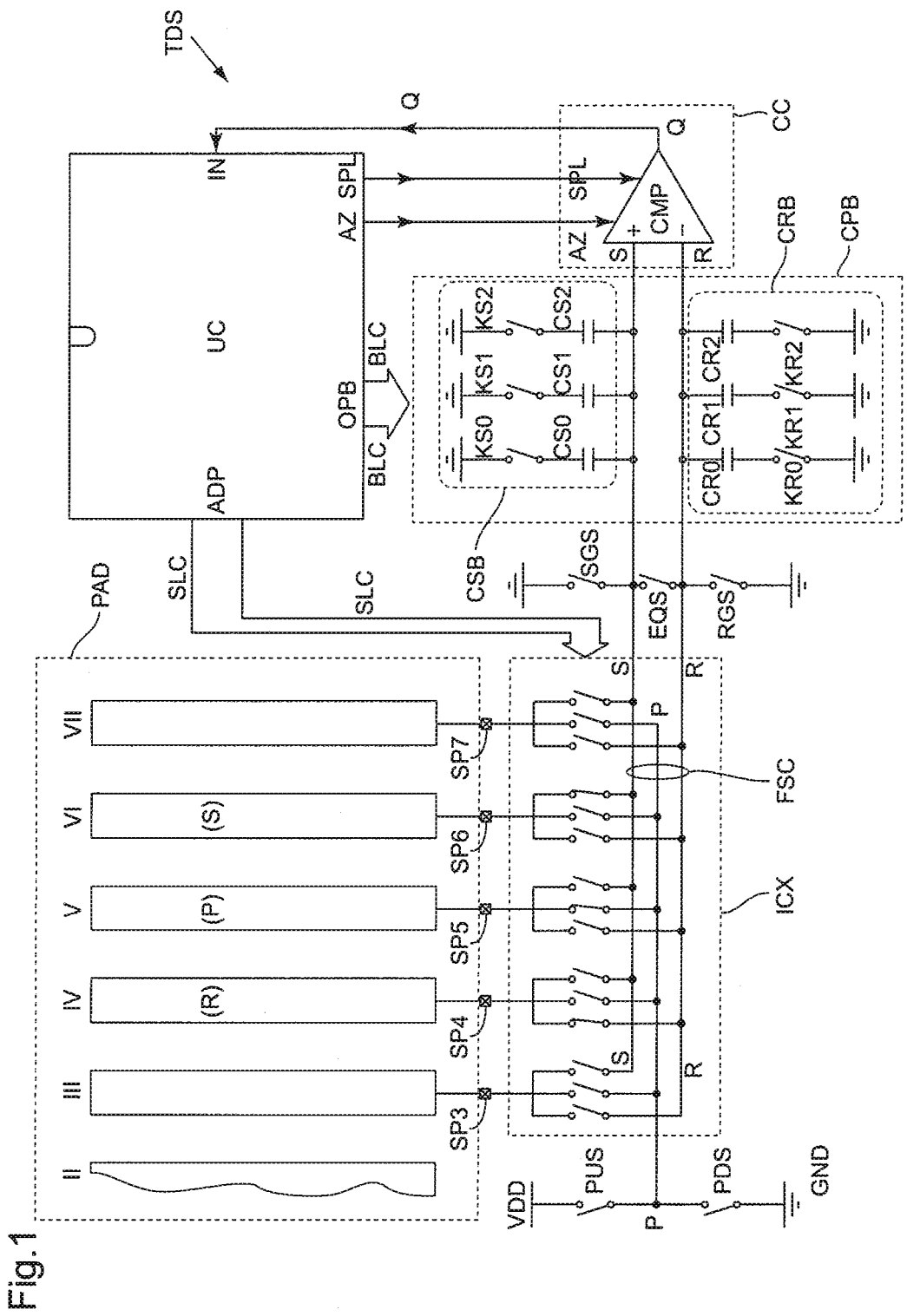
in FIG. 1, a diagram of the functional principle of the electronic circuits formed by a touch detection device according to a first alternative of realization of the invention associated with a touch surface comprising a regular pattern of parallel, linear conducting tracks.

It is an object of the present invention to realize a touch detection device based on an electrostatic principle and which makes it possible to correctly detect a touch or more generally the presence of a condensed body (pen, etc.) close to a touch surface in a reliable manner while avoiding false detections and a sensitivity to perturbations. More exactly, the object is the precise location of any touch (approach of a finger or presence of a body) relative to the two dimensions of the surface of reference (according to each axis of the plane), but where possible the object also includes locating this presence orthogonally to this plane of reference, which then implies making a capacitive measurement that is very fine and free of electromagnetic perturbations.

Furthermore, for several years already the display or flat screen television systems have seen a strong development, and attain a wide distribution while replacing the traditional cathode ray screens. Attempts have been made to associate the cathode ray screens with touch detection systems, based in particular on transparent films to constitute touchscreen devices provided with interactive functions between the image seen and the commands drummed with the fingers of a user. However, this kind of touchscreen generally suffers a relative lack of precision and a capricious sensitivity to the touch of a user.

According to an objective that is new and interesting in itself, the inventor has now suggested that it could be of interest to transform flat, widely distributed screens to add to them touch detection functions, so as to constitute in surprising fashion a flat display screen endowed with touch detection functions. Now the inventor has established that among the most widely distributed flat screens, the screens of the TFT type (according to the technology of thin film transistors) are based on an array of transistor cells transmitting a colored light spot (pixel), while the transistors are connected and power supplied by a matrix array of conducting rows and columns realized with transparent wire or conductor material. It is one objective to propose in an original fashion, to astutely reuse the conducting tracks of such screens, and combine them with a touch detection device according to the invention, in order to obtain in unexpected fashion a display screen system provided with touch detection functions, so as to obtain a flat touchscreen. Firstly, the task is that of having a device that in unexpected fashion could adapt and combine to the structure of existing flat TFT screens without modifying it or while modifying it in the least possible way. Second, the task is that of realizing flat TFT screens integrating these new functions of a touch detection device while modifying in the least possible way their industrial manufacturing process.

The difficulty that is encountered is that the screens of the TFT type have an array of parallel conducting lines arranged in a periodic pattern, but only in a plane situated on the inner side of this flat screen. The problem consists in reusing the existing structure of a TFT screen without perturbing it, and in adding thereto touch detection functions in order to obtain a touchscreen although the conducting lines are implanted in a single plane, on the inner side of the flat TFT screen.

We must solve this problem as previously announced, by avoiding any sensitivity to electromagnetic perturbations and by detecting correctly and surely the presence and precise location of a finger or any sensitive body close to the screen, and where possible in three dimensions, that is, according to the two dimensions of the screen surface and, where possible, in a third dimension, namely the distance of the body in the direction normal to the TFT screen surface.

Succinctly, these objects are attained according to one principle of the invention, by arranging a conducting surface comprising a regular pattern of conductors or conductive tracks (preferably periodic in one or two dimensions, and according to one or several levels of the plane of implantation), and proceeding to a differential detection of capacitive balance between pairs of conductors in several phases. It is planned to measure, or more precisely to detect and then quantify the existence of coupling between two neighboring conducting tracks, by implementing a principle of differential measurement by confronting or comparing the electrostatic coupling between one pair of neighboring tracks to the electrostatic coupling between another pair of neighboring tracks (without any contact between them, and without for them to necessarily follow one another). More precisely, according to the invention, one tests the capacitive balance between these two coupling values that are established between these two pairs of conductors. These couplings are electrostatic or capacitive. Each of these two couplings is formed between one conducting track and a neighboring track, which may be adjacent or not, close or far, immediately following each other or not in the regular pattern of the conductors of the touch surface. According to the invention, it is planned to advantageously compare a first coupling between a pair of neighboring tracks and a second coupling between another pair of neighboring tracks, with the particularity that these two pairs of tracks of the two couplings may have, and preferably have, one track in common. More precisely, several alternative modes of detection may be implemented. According to a first alternative, the track in common is a track of polarization P common to the two lateral tracks which serve, one as a reference track R and the other as a detection track S, on which the capacitive balance will be tested and a possible capacitive unbalance will be measured or more precisely quantified. In another mode of detection, the track in common serves as a track of detection S, and one accomplishes two polarizations P+ and P− on two lateral tracks by applying a positive potential jump on one of the lateral tracks (called 'positive polarization' P+), while applying a negative potential jump ('negative polarization' P−) on the opposite lateral track (symmetric to the other side).

According to embodiments of the invention, at least three paths are thus generally selected:
  one path of polarization P and two paths of reference R and detection S; or
  two paths of polarization, positive P+ and negative P−, and one path of detection S;
  or even, according to a combination of the two preceding alternatives, one has four paths: two paths of polarization, 'positive' P+ and 'negative' P−, as well as two paths of reference R and detection S, applied to respectively four, five, six or more conductors, always trying to conserve a symmetric or antisymmetric pattern of the diverse functions allocated to the conductors (for example, six paths P+/S/P− and P+/R/P− or five paths P+/S/P−/R/P+ or cycles of four paths . . . /P+/S/P−/R/ . . . ).

It should be noted that the functions of polarization, of reference and of detection may each apply to a group of several conducting tracks at once. In a general fashion, each path of polarization P or P+ or P−, of reference R or of detection S will be linked to at least one conductor or to a group of several conductors. Different configurations will be described and illustrated in the description given hereinbelow. Moreover, in order to map (detect, locate, and record) correctly any tactile approach or presence of a body near the whole touch surface, it is planned to scan the entire sensitive surface by selecting at each successive scanning operation a trio of different conductors. Several configurations of detection may in addition be combined advantageously, to obtain specific resolution profiles that will notably offer an ever more accurate (narrow) resolution or allow the surface to be mapped by dichotomic operations, i.e., successively detect a possible touch in the surface, then in each half of the surface, then in each quart . . . .

While the usual capacitive measures are taken between only two capacitor plates, that is, between two terminals or two paths, it is planned in an original fashion in embodiments of the invention, to have a beam with at least three paths that can be selectively connected by addressing to at least three conductors on the surface, the beam advantageously linking this trio of conductors or this trio of groups of conductors on the one hand, to the circuits of polarization, and on the other hand to the circuits of testing, detection, compensation, and quantification of the capacitive unbalance between the paths.

It is an advantage of the invention that by principle, the detection measure is of differential nature and is obtained by comparing and compensating two electrostatic or capacitive couplings that are formed respectively between one pair of paths and another pair of paths. Therefore, even if each coupling between one track and a lateral neighboring track will generally occur in an open manner, which exposes it to all external perturbations (contrary to a coupling between two plates of a capacitor), since the measurement is differential, the effects of electromagnetic perturbations on a coupling will also occur on the neighboring coupling and will neutralize by differential subtraction or comparison. The result of such a differential measurement consists therefore in merely revealing the phenomenon that is being sought, i.e., the tactile approach or the presence of a body close to the interval between two tracks, by making reference to the coupling between two other tracks that a priori are not perturbed by the touch.

Preferably, the effects of polarization and detection, and hence the two lateral couplings, originally are symmetric and balanced in the absence of any touch in the region of the relevant conducting tracks of the surface. On the other hand, in the case of a tactile approach or a presence of a body near a pair of two tracks, the corresponding coupling between these two tracks is perturbed and no longer balanced with respect to the second coupling between the other two paired tracks. The invention proposes precisely to test the capacitive balance between these two distinct couplings and to compare them. It is delicate to detect or measure a capacitive unbalance between three paths. In a surprising and improved fashion, the invention proposes to digitally measure this capacitive unbalance, by compensating it by the introduction of a variable transfer capacitance, e.g. a mere variable capacitance, in parallel onto one of the paths or between two paths, or even onto each of the two lateral paths or between the two paths and the third path. Even more surprisingly, the invention proposes to quantify or estimate digitally with discrete values the value of the capacitive unbalance of one path relative to another one. To this effect, the invention realizes a circuit having a variable capacitive impedance formed by a bank of switchable capacitors connected in parallel to the path(s) for which the capacitive unbalance should be compensated. The circuit comprises at least one bank of switchable capacitors connected in parallel, each branch of the bank comprising a switch preferably controlled by a digital control bit and a capacitor, where the capacitors have capacitances that are preferably staggered two by two. The capacitances of the capacitors put into the circuit by the digital switch command will thus become added so as to globally yield a cumulated capacitive impedance value that corresponds to the weighting of the binary digital command. In terms of the present invention, such a circuit is considered as a digital/capacitive conversion circuit.

It is further planned for the first alternative, to inversely realize a capacitive/digital conversion circuit. Such a circuit comprises two paths and a bank of switchable capacitors connected in parallel to at least one path, while the two paths are applied to the differential inputs of a comparator or amplifier circuit which outputs a state bit indicating whether the capacitance of one path is superior or inferior to the other. The output state is used by a feedback control circuit that can notably increase or decrease a binary digital command that controls the switching of the capacitors, the sum of capacitances of which thus varies as a function (and preferably in proportion) to the digital command up to the point where the global capacitances seen by the two paths are equal or close to the balance.

Advantageously, the touch detection devices provided according to the different alternatives of the embodiments of the invention can be associated and combined with all sorts of support having a regular pattern of conductors formed by conductive contact pieces, tracks, or lines implanted on a surface. In a particularly advantageous fashion, it will not be necessary that the tracks be implanted in two different planes. In certain applications several series of perpendicular tracks or tracks arranged in any sort of pattern (parallel, concentric, radial, maze, overlapping, diamond-shaped, honeycomb, or other) will be implanted in two separate planes. However, basically, according to the principle and different advantageous modes of detection of the invention, the conducting tracks can be implanted and inscribed in a single plane (or at least the same flat or curved surface, that is, a single level). In this way one advantageously obtains a touch detection system of the touchpad type.

In a surprising and particularly advantageous fashion, the touch detection device is associated and combined with the frame of the conducting addressing and control columns and/or rows of the transistor array for the display of the pixels in a matrix addressing screen of the type of a TFT flat screen, i.e., a screen with translucent thin-film transistors implanted into the internal plane face behind the surface of the flat screen. One thus transforms advantageously a display screen into a screen provided with a touch detection function, i.e. into a touchscreen.

Thus, certain embodiments according to the invention implement a method of detection and location of a tactile approach or presence of a body close to a surface that comprises at least one series of conductors distributed in a regular pattern in at least one plane, this method performing the following touch detection steps:
  selecting among such a plurality of conductors a beam of at least three conductors constituting, or connected with, three paths (as a beam);
  applying at least one polarization on the conductor or conductors of a polarization path of the beam, so as to establish at least a first (electrostatic or capacitive) coupling between at least one pair of conductors of said beam and a second (electrostatic or capacitive) coupling between at least another pair of said beam; and
  testing in a differential way the capacitive balance of the first coupling relative to the second coupling, from at least a detection path, in order to detect a possible capacitive unbalance, so as to detect and locate the tactile approach or presence of a body relative to said conductors.

Also, these embodiments of the invention can be realized with a system of detection and location of a tactile approach or presence of a body close to a surface that comprises at least one series of conductors distributed according to a regular pattern in at least one plane (and in at least one dimension), wherein the surface that comprises such a plurality of conductors is associated with a touch detection device comprising:
  an addressing circuit for selecting among said plurality of conductors a beam of at least three conductors connected to three paths, respectively;
  means for polarizing at least one conductor of said beam, in order to establish at least a first (electrostatic or capacitive) coupling between at least a first pair of conductors of said beam and a second (electrostatic or capacitive) coupling between at least another pair of conductors or said beam; and differential means for testing the balance of the first coupling relative to the second coupling, in order to detect and locate the tactile approach or presence of the body relative to said conductors of the surface.

More precisely, at least two alternatives for the detection modes are already apparent, and will be exposed in more detail hereafter.

According to a first alternative, after having selected three conductors out of the multitude of conductors implanted on the touch surface, one allocates to a first conductor a role of polarization (stimulation P), to a second conductor a role of reference (R), and to a third conductor a role of detection (S). An electric polarization, i.e. a jump of potential, is applied to the first, polarization conductor P by its low-impedance connection to a level of potential and more particularly a supply potential (GND or VDD). The other two conductors, R and S, go into a state of high impedance. However, the other two paths, R and S, are connected to the two inputs of a differential circuit (comparator or amplifier) in order to detect an electrostatic or capacitive unbalance. Moreover, the two paths R and S are connected to a bank of switchable capacitors connected in parallel between each of these paths R and S and the ground, or to another circuit having a variable capacitance, or more generally to another circuit having a variable transfer capacitance, in order to compensate and quantify the capacitive unbalance between these two paths R and S. To do so, one constitutes a beam of three conducting lines thus formed by the three paths of polarization P, reference R, and detection S, and these three paths P, R, and S are linked to three conductors selected by addressing and selecting means that are formed by a bank of switches (i.e., transistor-wired electronic switches) or multiplexers. The measuring operations, i.e., the testing, detection, or quantification of capacitive balance or unbalance, occur in several stages of calibration and detection or quantification. After each operation the addressing means modify the selection of the three conductors of the touch support that are connected to the three paths P, R, S of the beam (or possibly of three groups of several conductors connected to the three paths P, R, S), in order to scan all conductors of said surface and to locate the presence of a body or approach tactile, and find its exact position.

According to another detection mode, after having selected three conductors or three groups of conductors among the multitude of conductors implanted on the touch surface, one allocates to a first conductor X that is central or axial (symmetry plane) a role of detection S. Then one applies to a lateral conductor XI a positive potential jump (stimulation ΔVP on the path called 'positive' polarization P+), and to another lateral conductor IX that is symmetric on the other side an opposite, negative potential jump ΔVN (stimulation P−, called 'negative' polarization). The two lateral conductors IX and XI are connected to supply potentials P− and P+ and hence are at low impedance, while the first conductor X of detection S remains in a state of high impedance, though connected to a differential input (−) of a detection circuit CD (comparator or amplifier) in order to detect the appearance of a potential jump on the detection path S. First, prior to this phase of detection of a potential jump, there is a phase of calibration or reference in which a reference potential is established in order to then detect a possible potential jump during the second phase of detection.

During the first or reference phase a, the conductor X of the detection path S is short-circuited with a reference potential (voltage source) applied to the input − of the detection circuit CD (S at low impedance); the two lateral conductors IX and XI are set to an established potential or potentials (neutral, ground GND). Preferably, their potentials are inverted, that is, the polarizations P+ and P− are exchanged, the higher potential (VDD) being applied to conductor 1× and the lower potential (GND or −VCC) to the other conductor XI. During the second or detection phase β the detection path S applied to the other differential input+ of the comparator circuit CD is disconnected from the reference potential (state of high impedance). Conductor X of the disconnected detection path S conserves its capacitive charge. A positive potential jump ΔVP is applied to the polarization path P+ connected to conductor XI, and a negative potential jump ΔVN is applied to the other polarization track P− connected to conductor IX. One then finds on detection path S that a potential leap is produced during the phase transition α/β if a finger, a body, or an object approaches one of the tracks IX, X, or XI. The level of potential obtained on the detection path S connected to the axial conductor X during the first phase α (prior to the potential jump) thus serves as reference in this alternative mode of detection. The direction of the potential jump seen on the detection path S indicates on which side, IX or XI, of track X the touch is located.

Such a potential jump may thus signify that the presence of a body or tactile approach perturbs one of the two electrostatic or capacitive couplings between conductors IX and X on the one hand and conductors X and XI on the other hand. It is advantageously proposed according to the invention to detect the possible potential jump S between the two phases α and β, and if applicable to quantify the unbalance of coupling between the two pairs of conductors IX-X and X-XI, by compensating it at the input side by connecting in parallel a bank of switchable capacitors and/or by varying the equivalent capacitance of a variable capacitance circuit, more generally of a variable transfer capacitance circuit, between a fluctuating point connected to the detection path S and the polarization paths P+ and P−. The variable transfer capacitance circuit or switchable capacitor bank comprises capacitances in parallel between the two paths P+ and S and between the two paths S and P−, and thus connected in parallel to the "input" paths. At the "output", the detection path S is applied to a circuit of differential detection (comparator or amplifier) which detects when the balance between the two electrostatic or capacitive couplings is reestablished. Such rebalancing allows to quantify the unbalance of the two couplings between the two pairs of conductors constituting the three beam paths, on the basis of the digital value of capacitance of the variable transfer capacitance circuit or bank of capacitors that had to be added in order to neutralize the unbalance that had appeared initially.

Advantageously, the means of compensation of the electrostatic or capacitive unbalance between the different paths are realized as a switchable capacitor bank comprising at least one set of capacitors connected in parallel between one respective path and one neutral point that can be connected to a stable reference potential such as ground or supply potential or can form a fluctuating point connected to another path such as the detection path S. In the bank of switchable capacitors, each branch in parallel comprises a switch (preferably electronic, of the transistor type) in series with a capacitor having a determined value of capacitance. Preferably, the values of capacitance are staggered two by two (a ratio of two or 1/2) from one branch to another, and the set of switches is controlled by the state bits of a digital command. Thus, in astonishing fashion one obtains a digital/capacitive conversion circuit, that is, a circuit having at an input a binary digital control value and performing a capacitive conversion, i.e., converting this binary digital value into a capacitive value that is present between these two paths of output of this variable capacitance circuit or bank of switchable capacitors. In addition, in a variant such a circuit may comprise two switchable capacitor sets connected in parallel respectively between a first path (P−) or a second path (P+) and the fluctuating point of the third path (S). Such a variable capacitor circuit may receive a signed binary digital command, and depending on the binary sign, may either switch the first set of capacitors, to vary the capacitive impedance added between the first path and the neutral or fluctuating point, or in a symmetrical way switch the second set of capacitors to vary the other capacitive impedance that is added between the second path and the fluctuating point (3rd path S).

In the manner of a digital/analog converter, such a variable capacitance circuit formed by a bank of capacitors that are switchable according to a digital command may be considered as a digital/capacitive converter and may by itself constitute an invention.

In addition, in the first mode of detection it appears that a dual circuit is put to work which comprises one or two sets of switchable capacitors in parallel to one of the input paths R and S or to both input paths R and S. However, these two paths R and S are applied on the two differential inputs (+ and −) of a comparator or amplifier circuit which as a function of electrostatic balance or unbalance between the two input paths furnishes at an output a state indicator (bit Q) that is transmitted by a loop to a control and command unit that decides according to the state of indicator Q whether a new digital command would be applied to the input of the bank of switchable capacitors in order to vary the cumulated capacitance that the capacitors have on the corresponding path. This feedback loop acts so as to modify the capacitance added to the input paths R or S, notably by increasing or decreasing the binary digital command up to the point that the electrostatic balance between the two paths is attained or that the balance is almost attained (up to the quantifying threshold). This circuit thus comprises a bank of switchable capacitors mounted in parallel on one or two paths, a differential comparison circuit, and a control unit applying a digital command for the switching of the bank capacitors as a function of the comparison result of the circuit between the two paths, so as to subtantially equalize (rebalance) the value of capacitance on one path, as compared to the value of capacitance on the other path. Such a circuit thus performs the conversion of a value of capacitance present on one path (between one path and a stable reference potential: the ground) into an indication of the digital value (preferably binary) corresponding to said value of capacitance seen by the input path. Such a circuit can be considered in dual fashion to the digital/capacitive circuit seen above, as a capacitive/digital converter, extending the analogy with the analog/digital conversion circuits.

By convention, in the present invention the reference of voltages and potentials will be taken with respect to the ground GND, sometimes referred to as the earth, the potential of which is hence considered as null.

Moreover, the connections by switches which are schematically shown in the drawings as switches are generally accomplished by electronic switches such as transistors that can be of any type of technology: bipolar, field-effect (FET), tunnel effect, gate of metal on insulating oxide (MOSFET), TFT, etc.

The general view of FIG. 1 shows a first functional diagram of an electronic circuit implementing a principle of detection according to the invention.

According to the invention, a surface comprising a series of conductors arranged according to a regular pattern is associated with a device or circuit for detecting a touch to (proximity from) the conductors. In the simplified example of FIG. 1, the surface of conductor implantation consists of a series of parallel, linear conductive tracks that are equally spaced and isolated from one another. Such a surface comprising conducting tracks is a regular pattern implanted into a plane, that is to say, on a single level, the tracks being side by side. Such a conductive track pattern that is conserved by translation (slider) can be considered as one-dimensional though it occupies a unique plane in two dimensions.

In this first form of realization of a touch detection device according to the invention the circuit or device associated with this surface of conductive tracks comprises:

a beam of at least three conducting lines P, R, S that constitute three paths:
        a first path P of polarization, excitation, or stimulation,
        a second path of reference, R, and
        a third path of detection, S;
    addressing circuits ICX formed by a plurality of switching means or by a plurality of multiplexer circuits allowing to connect individually and respectively each conducting track . . . , III, IV, V, VI, VII, . . . to any of the following paths:
        path P of polarization (stimulation),
        path R of reference,
        path S of detection,
        or possibly to an established potential, for example a supply potential (VDD) or a ground potential (GND) when the conductor II, III, . . . , VII, . . . has not been selected by the addressing SLC;
        or in a non-switched state, these switches may not connect the track(s) . . . , III, . . . , VII, . . . considered (high-impedance state HI);
        preferably, the tracks are connected with the corresponding paths by direct, non-resistive connections, notably by electronic switches of slight resistance such as transistors, which can be of any type of technology, bipolar, field-effect, etc.;
    a first circuit PUS, PDS of polarization of path P (stimulation);
    another polarizing circuit RGS/SGS/EQS serving the function of discharge of the two paths of reference and of detection, R and S;
    a bank CPB of switchable capacitors or a circuit of variable transfer capacitance allowing to add a value of weighted capacitance to (re)balance one of both paths R and S;
    a differential circuit CC of comparison of the balance of the paths R and S, comprising an amplifier or a comparator CMP, for example, to which the paths R and S are applied and which allows the capacitive or electrostatic balance between these paths R, S of reference and detection to be tested; and
    a central unit UC for example constituted by a microprocessor circuit or, according to the example of FIG. 1, by a microcontroller controlling the addressing circuit ICX, the polarizing circuits PUS/PDS and SGS/EQS/RGS, the bank of switchable capacitors CPB having one or several variable capacitances on paths S and R, and the comparison circuit CC.

The central unit or control unit UC which receives the output Q of the comparison circuit CC, i.e., the state bit indicating the result of comparison or balance testing, controls the different circuits of the device (i.e., the addressing and polarizing circuits, the bank of switchable capacitors with variable capacitance CPB and the differential circuit CC that performs the capacitive balance testing) via adequate commands:

a code SLC of addressing and selection of the switches;
polarization switching phase commands (not represented);
a digital binary code BLC intended to rebalance or to compensate an unbalance between paths R and S;
commands for calibration and sampling of the comparison circuit CC (AZ: zero resetting; SPL: sampling).

In this first alternative, the first conducting line P or polarization path has a central role of polarizing one of the conducting tracks or a group of several conducting tracks of the surface PAD that is sensitive to the touch (i.e., approach of a finger or presence of an object or condensed body).

The other two conducting lines R and S of the beam constitute a reference path R and a detection path S, respectively.

Along the first alternative of the invention, it is planned that each of the paths P, R, and S constituting this trio of conducting lines is respectively connected with a corresponding conducting track . . . , IV, V, VI, . . . of the tablet.

In a first configuration that is simple and advantageous, and illustrated as an example in FIG. 1, the first conducting line P of the beam, that is, the polarization path P, is connected with a selected track of support PAD, here the central conducting track V. This track V then serves as the reference for the axis of symmetry. The second conducting line of the beam or reference path R is connected with a neighboring lateral track IV. This can be an adjacent track IV (not in contact and not necessarily immediately neighboring) such as in the simple configuration seen in FIG. 1, or a subsequent track that is further away, such as III or II. The third conducting line S of detection beam or path S is connected to a third track VI that can be the other neighboring track of axial track V or a subsequent track VII, . . . .

When in functioning, the microcontroller sends the addressing command SLC of adequate selection on the addressing bus to the set of switches of the addressing and connection circuit, which connects or provokes the connections as follows (according to the configuration example of FIG. 1):
the polarization path P of the beam is connected to the conducting track V;
the second conducting track IV is connected to the reference path R;
the third conducting track VI is connected to the detection path S.

The last two, that is, the detection path S and the reference path R, are connected to the two differential inputs + and − of the comparator circuit CMP, and are connected to two sets of capacitors CS0, CS1, CS2, . . . and CR0, CR1, CR2, . . . connected in parallel between each line S or R and the ground GND (or any other established potential, of fixed reference).

The polarization path P is connected to the first polarizing circuit that comprises a pull-up switch PUS for bringing its potential to a superior value, for instance raising it to the positive supply potential VDD, and a pull-down switch PDS for bringing its potential to a lower value (negative or null) like that of the ground GND of the power supply.

The other two paths, of reference R and detection S, are connected with another circuit of polarization or depolarization (discharge) that comprises for example two or three switches such as SGS, EQS, RGS according to the realization in the example of FIG. 1. A first switch RGS for setting to the ground potential connects the reference path R to a level of stable potential such as the ground. Another switch SGS for setting to the ground potential connects the detection path S to a level of stable potential, here the same ground potential GND. In addition, the two paths of reference R and detection S may alternatively or cumulatively be directly interconnected by a switch EQS of potential leveling or shorting, thus allowing by shorting to bring them to the same potential, that can be floating and different from that of the ground or of other stable potentials that would be imposed to them by closing of the switches SGS and/or RGS.

In functioning, the invention carries out an entire series of reading (testing or probing) operations by scanning the tracks, by selecting at each operation a different trio of conducting tracks of the support touch surface, such as a touchpad or touchscreen.

In each reading operation, at least three conducting tracks are selected: one for polarization P, another for reference R, and still another for detection S.

Figure 4:
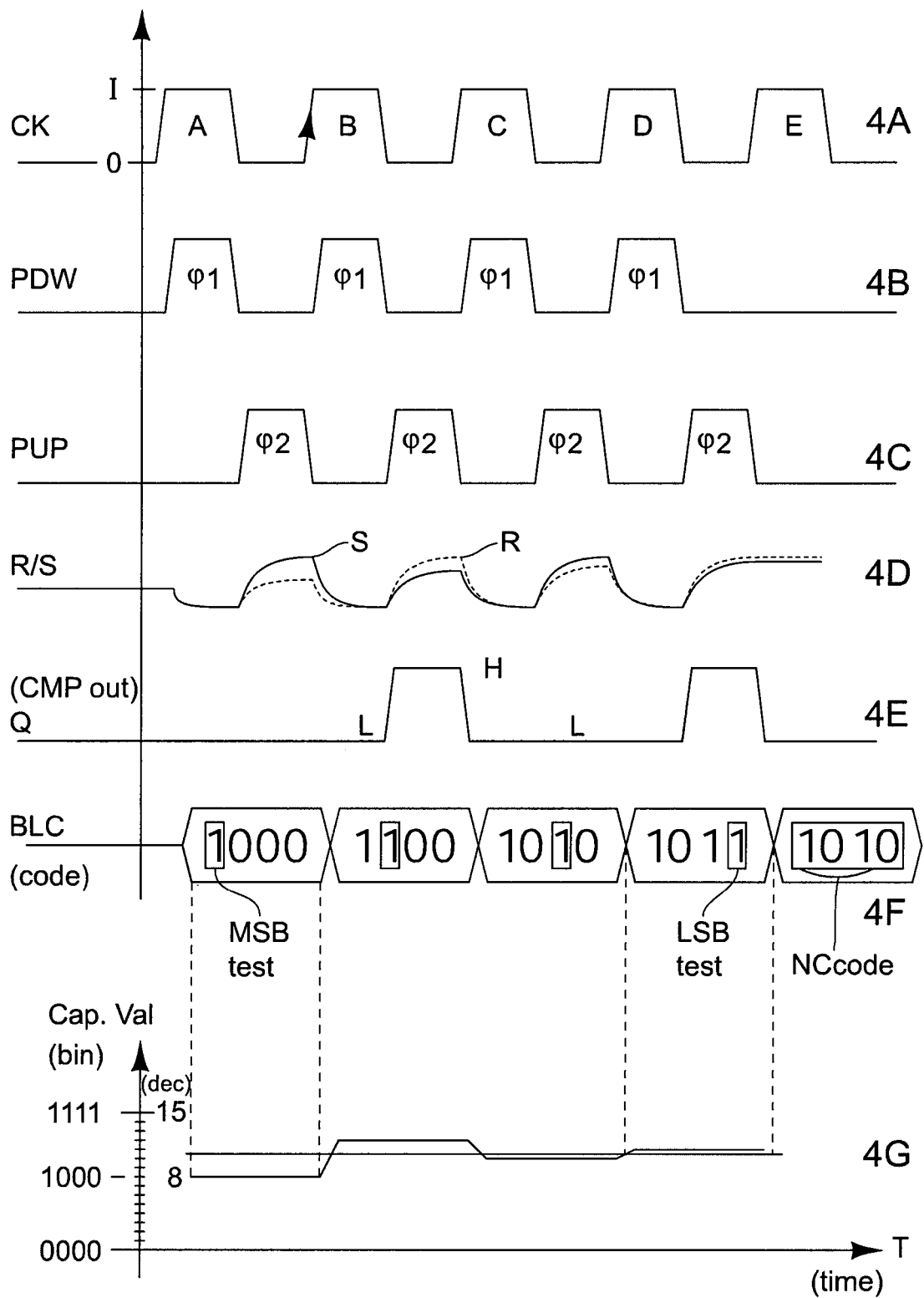
in FIG. 4, a series of time diagrams 4A to 4G showing a succession of phases and cycles of polarization PDW and PUP, of tests of the balance of the paths R/S, of differential detection CMP, and of successive quantification operations by digital code BLC up to neutralization of the capacitive unbalance according to the first mode of detection according to the invention.

During each reading operation, several (two or three) phases are distinguished, called Phase 1, Phase 2, and/or Phase 3, as illustrated in FIG. 4.

In the beginning and during the entire reading (testing or probing) operation the addressing bus SLC of the microcontroller sends a selection command SLC which positions the electronic switches so that, according to the example of configuration in FIG. 1, the polarization path P be connected with the conducting track V, the neighboring track IV be connected with the reference path R, and the other neighboring track VI be connected with the detection path S.

In the first phase ($\phi 1$), the first path P is brought to a stable reference potential VP1, preferably the potential of ground GND, by the first polarizing circuit PUS-PDS. The pull-down electronic switch PDS is for instance closed in order to bring the potential U of the line P to the potential 0 of ground GND.

During the same phase $\phi 1$, a known difference of potential $\Delta VSR$ is applied (imposed) between the second path R and third path S, and thus here between the conducting tracks IV and VI (example of FIG. 1). Preferably, this potential or voltage difference $\Delta VSR = U_S - U_R$ is zero, that is, the conducting lines of the two reference and detection paths R and S are brought to the same potential. According to the realization example of FIG. 1, such an imposed polarization can be obtained:
by closing the electronic switch EQS in order to short-circuit the conducting lines R and S of the beam, thereby equalizing their respective potentials; or
by closing the two pull-down switches SGS and RGS, in order to bring the potential of each conducting line S or R to the potential 0 of ground GND, so that these two paths of reference and detection, R and S, are at the same absolute potential 0;
alternatively, the pull-down or pull-up switch(es) can connect one or each line S or R individually to a non-zero potential VS1 or VR1, in order to establish a non-zero potential difference $\Delta VSR = VS1 - VR1 \neq 0$ in a simple manner;
or by closing these three switches SGS, EQS, RGS, which assuredly brings the potentials of the two detection and reference paths, S and R, to the same null potential 0, of ground GND.

It follows that during this first phase $\phi 1$ the polarization path P, and hence the conducting track V, are brought to a reference potential, as for instance 0, and the reference and detection paths R and S, and hence the conducting tracks IV and VI, are brought to a known potential (or voltage=potential difference), preferably null 0.

It follows that during this phase, a known potential or voltage difference, preferably zero (0), is imposed at the inputs +/− of comparator CMP. It is planned that the microcontroller UC applies a zero resetting command AZ to the comparator CMP, in order to force its balancing or more precisely its calibrating, so that its output be zero (this is necessary in particular in the alternative where a non-zero potential difference $\Delta VSR \neq 0$ is applied between paths S and R at the inputs + and − of comparator CMP). Optionally, the measuring or quantifying error of the comparator circuit may be measured or established at this occasion. Optionally, the inactive conductors such as conducting tracks II, III, and VII as well as track V and the polarization path P could be either connected to the ground or left floating, that is, left not connected or in other words at a level of 'high impedance'.

At the end of this first phase ($\phi 1$) of the operation, pull-down switches PDS, SGS, RGS and/or EQS that have pulled down or canceled the potentials R, S, and/or P are relaxed (switches open), so that potentials R and S become floating or in a state of 'high-impedance'.

During the second phase ($\phi 2$), then, a variation of potential $\Delta VP$ is imposed onto the polarization path P, which is also called stimulation path. This can be obtained by applying any potential $U_P$ on the polarization path P of the beam and notably by shorting the line of polarization P with a level of non-zero established reference potential such as that of supply VDD. Thus, following the example of realization of FIG. 1, one can elevate the potential of the polarization path P, and hence that of track V in the example of FIG. 1, by closing the pull-up or potential increase switch PUS that connects the polarization line P with the positive supply line VDD.

As a consequence, during this second phase $\phi 2$ the path P and the axial track V are brought to a new potential VP2 that differs from the rest potential VP1 of phase 1. In an equivalent fashion, one may provide that the first polarization circuit applies a voltage jump (voltage jump or square signal or succession of two potential levels separated by a transition front) on the line of polarization P, as suggested by the time diagram of phases $\phi 1, \phi 2, \ldots, \phi 1, \phi 2$ in FIG. 4 illustrating a succession of phases of reference $\phi 1$ (calibration) and testing $\phi 2$ (detection) and, as the case may be, of a quantification $\phi 3$ of capacitive unbalance between the reference and detection paths R and S (comparison and/or quantification) implemented according to the first alternative of the invention.

During this second phase ($\phi 2$) and more precisely during a sampling phase ($\phi 3$) one detects the capacitive unbalance, i.e., the unbalance of the electrostatic charge, via the potential difference between the detection path S and the reference path R with the aid of the comparator circuit CMP of which the inputs + and − receive the two paths S and R.

It is planned more precisely during the first alternative of realization of the invention, to quantify the electrostatic unbalance between the reference path R and the detection path S.

More exactly, such a detection or physical measuring step consists in quantifying a possible capacitive unbalance between the two paths S and R, that is, between the conducting tracks of reference IV and detection VI (according to the indicative example of FIG. 1) or, in other cases, in confirming that the reference path R and detection path S are balanced (in equilibrium), i.e., that tracks IV and VI are in electrostatic equilibrium.

As a beginning of a physical explanation, it would seem that an electric coupling is established between the axial track V that has been brought to a potential P and each of the neighboring tracks ..., III, IV and VI, VII, ..., in particular the immediately neighboring lateral tracks IV and VI. In this phase $\phi 2$, tracks IV and VI that are connected to the paths R and S are floating, or in a state of 'high impedance'. The two lateral couplings, which are of an electrostatic nature, or more precisely of an a priori capacitive nature, induce a change of the potential of each of the neighboring conducting tracks IV, VI, and thus of the paths R and S, under the effect of the polarization voltage jump $\Delta VP$ on the reference axial track V.

Figure 2A:
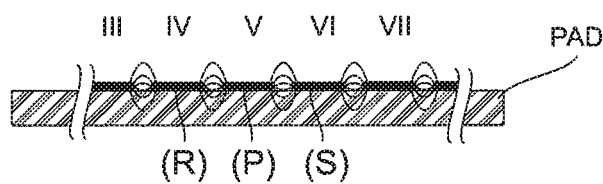
in FIG. 2A, a transverse sectional view of a series of regular, parallel tracks implanted onto a support, like the pattern of FIG. 1, showing tracks with functions of polarization P, reference R, and detection S according to the first alternative of realization of the invention, and schematically showing the appearance of electrostatic coupling effects between neighboring tracks.
Figure 2B:
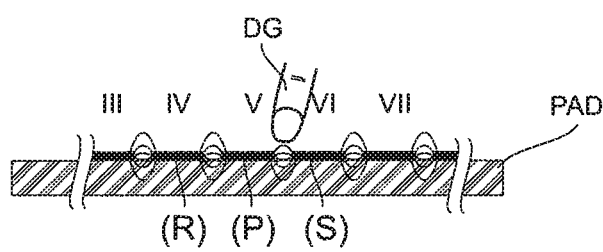
in FIG. 2B, a view analogous to FIG. 2A which schematically shows a touch perturbing the electrostatic balance between the polarization track P and detection track S, wherein the unbalance can be detected and quantified by a device according to the invention.

If the environment of certain tracks, for example V-VI as illustrated in FIG. 2B, is perturbed by the presence of a body DG other than air or vacuum, such as the approach of a finger DG or the presence of an object such as a pen, a ruler or a stylet, metallic or not, conducting or not, in short a condensed body of permittivity $\in_1$ or of permeability $\mu_1$ which are distinctly different from those of air or vacuum, $\in_0$ or $\mu_0$, then the electrical, electrostatic or capacitive coupling between the axial track V and the neighboring track VI is perturbed and modified by this presence.

More exactly, a tactile touch DG appears to modify the value of electrostatic or capacitive coupling that exists between two neighboring tracks V and VI, which value is usually considered as a parasitic capacitance or a leakage conductance (inverse of impedance) between these two tracks. The phenomenon is subtle.

To detect it, the invention proposes in an original and advantageous fashion to compensate such a variation of electrostatic coupling by neutralizing it with an addition of counterweight capacitances connected in parallel between the path S or R that is to be rebalanced and the ground GND or any other stable potential such as VDD. This is permitted in unusual fashion according to the invention by introducing on each path of detection S and reference R a bank CPB of switchable capacitors CS0, CS1, CS2, ... or CR0, CR1, CR2, ... mounted in parallel between the corresponding path S or R and an established potential such as the ground GND.

Each bank of switchable capacitors consists of the conducting line corresponding to the path of detection S or reference R of the beam and of a set of several capacitors CS0, CS1, CS2 and so on, mounted in parallel between said path S or R and the stable potential, that is, ground GND. Each shunt comprises a capacitor CS0 in series with an electronic switch KS0 between the conducting line S and the ground reference potential GND. When switch KS0 is opened by an adequate control code BLC of microcontroller UC, capacitor CS0 is out of the circuit, and its capacitance is not involved in the overall capacitance of line S relative to ground GND. When all switches KS0, KS1, KS2 etc. have been opened by the balancing control code BLC of microcontroller UC, no capacitance is added to the own capacitance CSi of line S relative to ground GND. When switch KS0 is closed by an adequate rebalance control code BLC from the control unit UC, the value of capacitance of the capacitor CS0 will be added to the own capacitance CSi of line S and of the conducting track VI to which path S is connected. When switches KS0 and KS1 are closed by an adequate rebalancing code BLC, two capacitors CS0 and CS1 are put into the circuit between line S and ground potential GND, and the cumulation of values of the capacitances of these two capacitors CS0+CS1 will be added to the own capacitance CSi of path S. When three switches KS0, KS1, and KS2 are closed by an adequate rebalancing code BLC, three capacitors CS0, CS1, CS2 are put into the circuit between line S and ground GND, and the cumulation of values of the capacitances CS0+CS1+CS2 will be added to the own capacitance CSi of track S.

Consequently, when the presence of a body and notably the approach of a finger close to the conducting track VI (path S) of the touch surface enhances its capacitive charge, the microcontroller UC may control in a controlled manner the switching of a selection of capacitors CS0, CS1 or CS2 ... whose capacitance cumulated value CS0 or CS0+CS1 or CS0+CS1+CS2 will be added to the intrinsic capacitance CSi of line S to compensate its variation and reestablish the balance in an adjusted manner.

To this effect it is necessary to carry out a comparison with respect to a reference in order to be able to adjust this sort of capacitive counterweight to the variation of electrostatic coupling. This is the role of reference path R that is connected to another conducting track IV of the surface of the touch support (touchpad or touchscreen). The conducting track IV to which reference path R is connected is selected so as to be symmetric to the conducting track VI of detection S, so that their respective values of electrostatic or capacitive coupling with the conductive track V of polarization P be substantially the same. One will choose a regular pattern of conducting tracks II, III, IV, V, VI, VII or VIII, IX, X, XI, XII implanted on or below the touch surface. Moreover, during the first phase φ1 the comparator circuit CMP will receive a zero-resetting command AZ, which allows this differential circuit CC to be calibrated.

This process is somewhat analogous to the principle of double weighing with a weighing bridge, where during a first phase of calibrating of the weighing a charge is placed on the scales and balanced with counterweights, by adding a succession of small calibrated weights in order to exactly locate the point of rocking; then during a second stage of weighing, the charge is withdrawn, and one compensates its absence by its replacement with a sum of small calibrated weights, so as to return to the equilibrium of the rocking point. The sum of the added small calibrated weights corresponds to the exact weight of the charge, independently of the fact that the scales would be exact or not (balanced or faulty).

According to the present invention, it is foreseen that the microcontroller UC implement a process that is somewhat analogous, by first calibrating the comparator circuit during the first phase φ1 by imposing first the same potential ΔVSR=0 to the paths R, S of reference and detection, in order to cancel the effect of the presence of a body close to conducting tracks IV, V, VI; then during the second phase φ2, a possible electrostatic or capacitive unbalance is detected between the two paths S, R of detection and reference under the effect of polarization P. In this case this unbalance indicates the presence of a perturbing body, the microcontroller UC as a function of the state of output Q of comparator CMP and especially its sign triggers a process of increasing or decreasing the (re)balancing code BLC, so as to put into the circuit, either certain capacitors of the set of capacitors CS0, CS1, CS2, . . . or certain capacitors of the other set of capacitors CR0, CR1, CR2, . . . , CRn, until the balance is reestablished, in the manner of the weighting or rebalancing of the plates of scales or of a weighing bridge.

Figure 3:
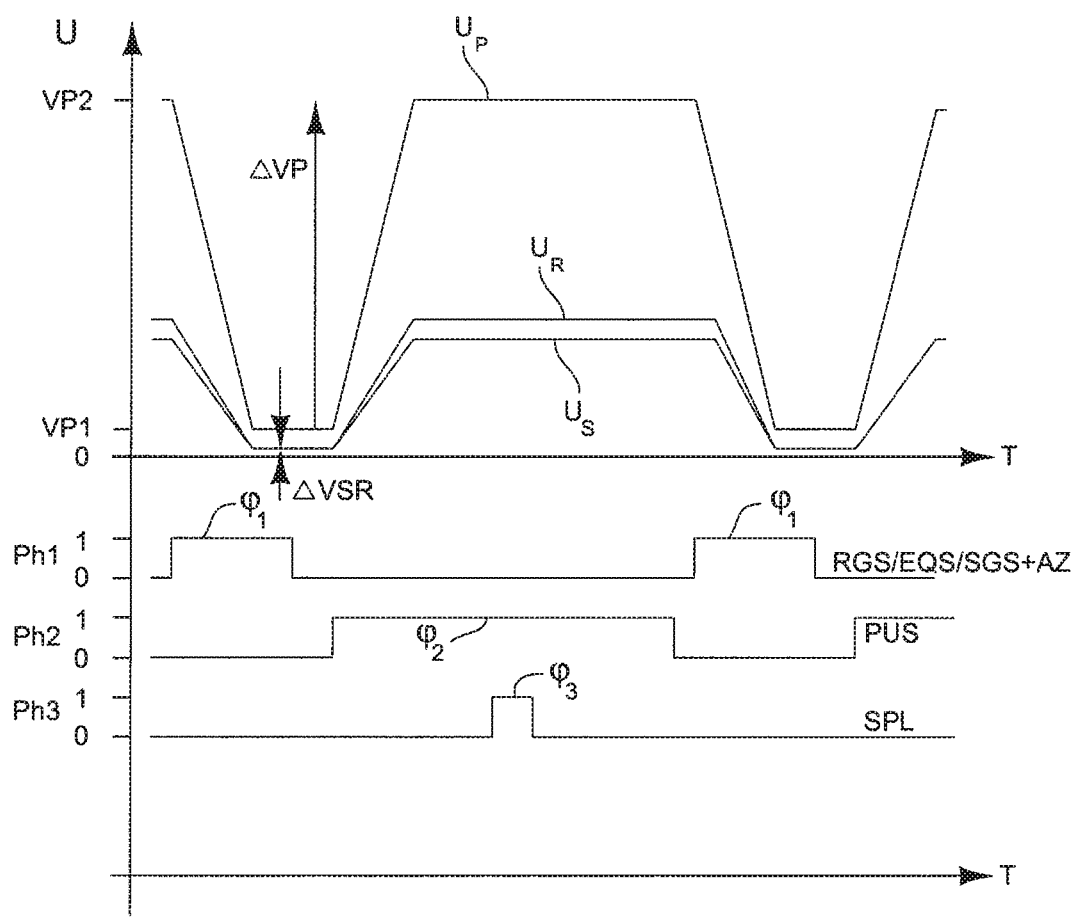
in FIG. 3, a time diagram of the phases and levels of polarization and detection implemented by a touch detection device according to the first alternative of realization of the invention.

It is possible to reestablish the balance by successive approximations, by putting into the circuit in succession a capacitor CS0, then two capacitors CS0 and CS1 having a capacitance of CS0+CS1, then three capacitors having a capacitance of CS0+CS1+CS2, etc., during one and the same polarization sequence as illustrated in FIG. 3, without proceeding to a new sequence of depolarization φ1 and repolarization φ2 (no discharge ΔVSR=0 nor a new stimulation Up=VP2, but several successive samplings φ3, φ3', φ3", etc. of the comparator during the testing phase φ2).

Preferably though, it is foreseen to adjust the digital code BLC of control of the bank of capacitors CPB in several cycles, by reinitializing the polarization of the conductive tracks in each cycle. FIGS. 4A to 4G schematically show the succession of cycles A, B, C, D of adjustment of the value of variable capacitance of the bank of switchable capacitors as a function of a succession of digital commands BLC of adjustment of the capacitance value of the capacitors put into the circuit. During the initial phase φ1 of each cycle A-B-C-D . . . , the three paths P, R, S of the beam and the corresponding tracks IV, V, VI are discharged. A reinitialisation pulse PDW commands the discharge of the conducting tracks P, R, S and the return to an initial value of polarization. This is made by closing the switches PDS (pull-down switch) SGS, RGS, and/or EQS, to set the three paths P, R, S back to the lower reference potential such as the zero potential of ground GND. Then, during the second phase φ2 of each cycle A-B-C-D . . . , a pulse PUP of polarization or stimulation is applied and commands once more the closing of the switch PUS, so as to pull up the potential $U_P$ of the polarization path P to an established reference potential VP2 such as the upper supply potential VDD. Such a succession of cycles A-B-C-D of discharge φ1 and repolarization φ2 to adjust the value of capacitance of the bank of switchable capacitors is preferable, since advantageously, it allows to avoid charge injection phenomena, since the closures and openings of the switches of the bank of switchable capacitors notably induce charge transfers which do not have a neutral charge balance and perturb rapidly the return to equilibrium and the capacitive/digital conversion. It is preferable in general manner to accomplish any modification of the command BLC of switching of the bank of switchable capacitors CPB at the beginning of a respective phase φ1 of discharge (sequence of phases φ1 of depolarization PDW) before going to the phase φ2 of detection and proceeding to the potential jump ΔVP of polarization $U_P$ (stimulation P), then to the comparison CMP of potentials $U_R$ and $U_S$.

In a particularly advantageous manner, it is planned according to the invention that the bank of switchable capacitors comprising the two capacitor sets CS0, CS1, CS2, . . . , CSn and CR0, CR1, CR2, . . . , CRn has capacitance values that are staggered in increasing or decreasing value, and preferably (de)creasing in a geometric succession of ratio q:CS0=q·CS1=q·q·CS2, preferably of a ratio of twos, such as CS0=2×CS1=2×2×CS2. Thus, like a sample of weights of 1 kg, 500 g, 250 g, etc. one can find the combination of capacitances CS0, CS1, CS2, . . . , CSn that will be suitable (within the error of the smallest capacitance CS0 or CSn) to compensate the electrostatic unbalance between the two paths of selection and reference, S and R, and adjust the capacitive rebalancing carried out by this capacitive bank circuit.

Thus, according to the separate example of realization of FIG. 1 it is possible to conceive a bank CPB of switchable capacitors composed of a first set CSB of capacitors connected in parallel to an input line S and having for instance two, three, four, . . . , seven or more capacitors CS0, CS1, CS2, CS3, . . . , CS6, . . . , CSn, to which can be added a second set CRB of switched capacitors connected in parallel to another input line R, and to provide a digital rebalancing command BLC coded on two, three, four, . . . , seven, . . . , or n+1 bits to which can be added a bit of sign A+/− (to form for example eight bits, that is, a byte) A0, A1, A2, A3, . . . , A6, . . . , An and A+/−.

The first bits A0, A1, A2, . . . trigger the selective switching and circuit insertion of the corresponding capacitors CS0, CS1, CS2, . . . , CSn. Advantageously, the capacitances of capacitors CS0, CS1, CS2, . . . , CSn are staggered in twos, so that their capacitive weighting corresponds to the weighting or binary weight of the corresponding bits.

Thus, for example, when the command BLC=A has a value of zero, the binary code A0-A1-A2-A3- . . . -An=00000000 triggers the opening of all switches and sends all capacitors off the circuit, so that the overall capacitance present on the lines takes on the value CSb=0.

For a value A of 1, or binary code A0-A1-A2-A3- . . . -An=10000000, the command BLC=A to the bank of capacitors closes only one switch KS0, and the circuit has on line S a capacitance CSb=CS0.

For a value A of 2, which corresponds to a binary code of A0-A1-A2-A3-...-An=01000000, the command BLC=A to the bank of capacitors closes a single switch KS1, and the circuit has a capacitance CSb=CS1 on line S, which is double (or half) of CS0.

For a value A of 3, which corresponds to a binary code of A0-A1-A2-A3-...-An=11000000, the command of BLC=A to the bank of capacitors closes the switches KS0 and KS1, and the circuit exhibits on line S a capacitance CSb=CS0+CS1, which is the sum of the preceding values, i.e. triple of CS0 (or CS1).

And so on.

For a value A of N, or a bit code A0-A1-A2-A3-...-An that corresponds to the binary decomposition of N, the command BLC=A to the bank of switchable capacitors closes or not the switches KS0, KS1, KS2, KS3, ..., KSn depending on the state, 0 or 1, of the corresponding bits A0-A1-A2-A3-...-An, so that the circuit has on line S a capacitance Cs=CS0±CS1±CS2±CS3± ... ±CSn which corresponds to the cumulation of capacitances of the capacitors effectively put into the circuit, said cumulation actually having a value CSb of N times CS0 (or N times CSn).

It can be foreseen as an option that, when the sign bit A±changes state for the state of 1, for example, it will be the other set of switchable capacitors CR0, CR1, CR2, CR3, ..., CRn that is put into service, so that their respective capacitances are added on the other line R as a function of the state of the bits A0-A1-A2-A3-...-An, for example according to the prior recurrence relation.

Surprisingly, such a circuit comprising a bank CPB of variable capacitance that is composed of one or two banks CSB and CRB of switchable capacitors where the switches are commanded by a digital balancing code BLC, constitutes by itself in inventive fashion a digital/capacitive conversion circuit (CNC), by analogy with a digital/analogous converter.

In a complementary and inventive way per se, inversely, the circuits CPB, CMP, UC realize a circuit of capacitive/digital conversion (CCN).

Such a circuit that is apt to convert a value of capacitance C to a digital quantification A indicating the value of capacitance C comprises one or two input paths S/R, a bank of variable capacitance CPB composed of one or two sets of switchable capacitors CSB/CRB where the switches are commanded by a digital code BLC (of command, control, selection, or balancing), a comparison circuit CC, and a decision circuit UC accomplishing a feedback able to increase or decrease the digital code A applied to the command BLC that commands the number and rank of capacitors CS0, CS1, CS2, ..., CSn or CR0, CR1, CR2, ..., CRn put into the circuit.

Other variable capacitance means can be implemented according to the invention in order to rebalance the two paths of detection and reference, S and R, and compensate the appearance of a possible unbalance between the two electrostatic couplings. More generally, other variable transfer capacitance means, including means having an equivalent effect to a mere variable capacitance, can be implemented to rebalance the paths S and R. FIGS. 6A, 6B, 6C and 6D, which will be commented later on, schematically show other realizations of circuits offering a variable transfer capacitance on reference path R relative to ground GND.

An accepted definition of the capacitance is the proportionality factor C linking two potential variations $\Delta V1$ and $\Delta V2$ with the variation $\Delta Q$ of an electrical charge:

$$\Delta Q = \Delta V1 * C - \Delta V2 * C$$

Figure 20A:
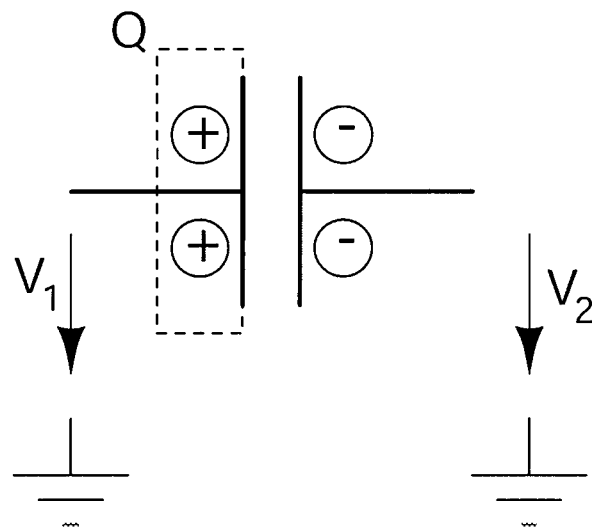
in FIG. 20A, a diagram representing the charges and the lead (plate) potentials of an element having a mere capacitance property; and in FIG. 20B, a diagram representing the charges and the potentials of a circuit having a transfer capacitance property.
Figure 20B:
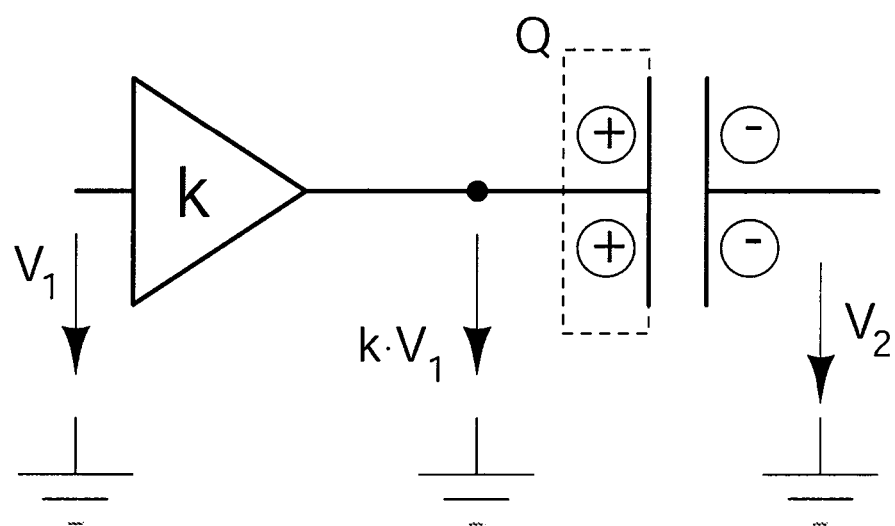

A variable capacitance means a variable proportionality factor between the charge and the potentials. One way to modify this factor is to change the interconnection arrangement of capacitors, or to change the biasing potential of a diode used as a varicap. However, as the above formula reveals it, another way to vary the proportionality between a potential variation, for example $\Delta V1$, and a variation of electrical charges $\Delta Q$ is illustrated in FIG. 20B (to be compared with FIG. 20A which illustrates a mere capacitance). Adding an amplifier device having a variable gain (amplification or attenuation) factor k modifies the potential variation $\Delta V1$, and therefore the actual potential variation seen at the first lead of the capacitor, into $k\Delta V1$. Varying the gain factor k allows effectively to modify the proportionality factor between a potential variation $\Delta V1$ and a charge variation $\Delta Q$. Formally, the capacitance of the capacitor element is not modified by a modification of the gain k. Furthermore, the device shown in FIG. 20B is at least a tripole device, due to the need for a reference potential in order to be able to define a gain factor k. However, a proportionality factor linking the variation of potential $\Delta V1$ with the variation of charge $\Delta Q$ is still present, and can indeed be modified and controlled by means of the gain factor k. Such a proportionality factor is commonly referred to as "transfer capacitance" or in some literature as "transcapacitance" (see for instance the book entitled "Nonlinear Microwave and RF Circuits", by Stephen A. Maas, published by Artech House, 2003, §2.2.7.2). Transfer capacitance is measured in the unit of Farad, as is capacitance. The concept of transfer capacitance includes the concept of capacitance (shown in FIG. 20A) embodied by simple dipole capacitor(s). However, unlike a mere capacitance, a transfer capacitance other than a mere capacitance may transform a potential variation at a node of the transfer capacitance circuit to a charge variation at another node of said circuit.

Figure 6A:
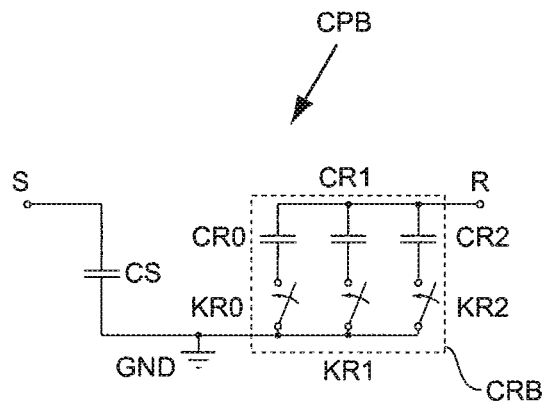
in FIG. 6A, a diagram of a variable transfer capacitance circuit having a variable capacitance and comprising a bank of switchable capacitors according to the invention.

The circuit diagram of FIG. 6A is a bank of switchable capacitances comprising a single set of capacitors CR0, CR1, CR2, ... which functions similarly to one of the sets of the bank of switchable capacitors CPB of FIG. 1. The detection path S simply comprises a capacitor CS having a fixed capacitance value linked between path S and ground GND. The reference path R is linked to several branches in parallel between path R and ground GND which each comprise a capacitor CR0 or CR1 or CR2 ... or CRn connected in series with a respective switch KR0, KR1, KR2, ..., or KRn between path R and ground GND. In functioning, a balancing code (not represented) of several bits A0, A1, A2, ..., or An commands the closing or opening of the respective switches KR0, KR1, KR2, ..., KRn. Thus, the overall capacitance CRb that is presented by path R relative to ground GND varies as a function of the cumulation of the capacitances of capacitors CR1, CR2, CR2, ..., and/or CRn put into the circuit.

Figure 6B:
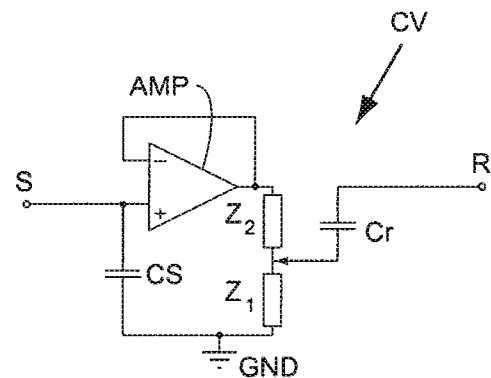
in FIGS. 6B, 6C and 6D, other functional diagrams of electronic variable transfer capacitance circuits which can be implemented in a touch detection device according to the invention.

FIG. 6B shows a circuit having a variable transfer capacitance that comprises an amplifier AMP mounted as a follower (the output looping over the inverting input −). A first path formed by the detection path S is applied to the other input (+, noninverting) that is connected to ground GND via a reference capacitor CS of fixed capacitance. The output of the amplifier AMP is applied to one terminal of a variable resistor or potentiometer Z1+Z2 the other terminal of which is connected to the ground. The intermediate terminal between Z1 and Z2 that forms the point of regulation of the potentiometer is connected to another path formed by reference path R via a coupling capacitor Cr. In functioning, such an amplifier follower circuit produces a variable transfer capacitance in parallel to the reference path as a function of the regulating ratio of potentiometer Z1/(Z1+Z2), of the reference capacitance CS, and of the coupling capacitance Cr.

Figure 6C:
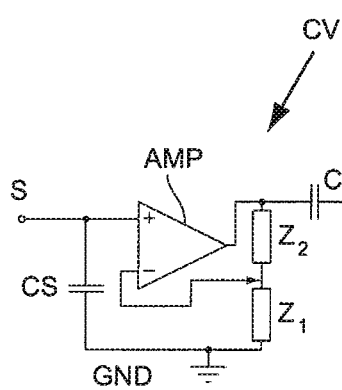

FIG. 6C shows another electronic circuit having a variable transfer capacitance on path R. This circuit with variable capacitive coupling has an amplifier AMP mounted with variable gain (Z2+Z1)/Z1 regulated by the potentiometer Z1–Z2. The first path S is applied to the noninverting input + of amplifier AMP, which is connected to the ground by a capacitor CS of fixed capacitance. The other differential input (–, inverting) is applied to the intermediate terminal of a three-point potentiometer Z1+Z2 of which the two end terminals are connected between the output of the amplifier and of the ground GND. The output of amplifier AMP is transmitted via a coupling capacitor Cr to a second path formed by reference path R. In functioning, such a circuit mounted as a variable gain amplifier has in parallel between the output of reference path R and ground GND a capacitive coupling that is variable as a function of the regulating ratio of the potentiometer Z1/Z2.

Figure 6D:
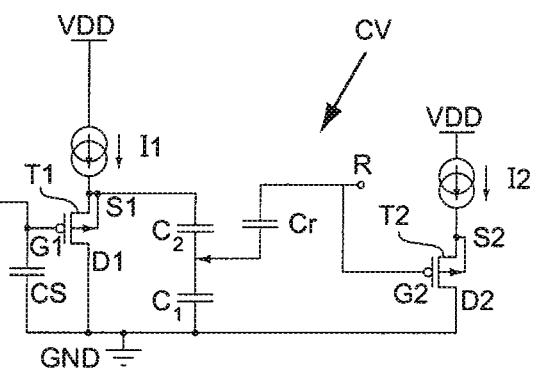
Figure 7A:
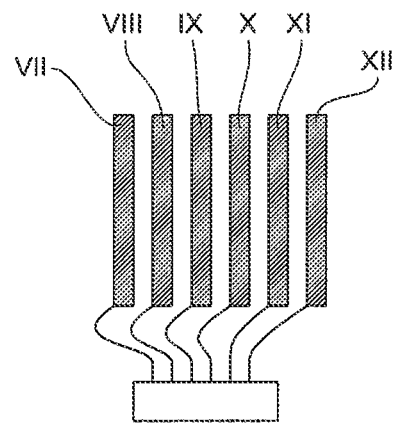
in FIG. 7A, a top view of a regular pattern of parallel, linear conducting tracks implanted on a support or touch surface (touchpad) which can be associated with a touch detection device according to the invention.
Figure 7B:
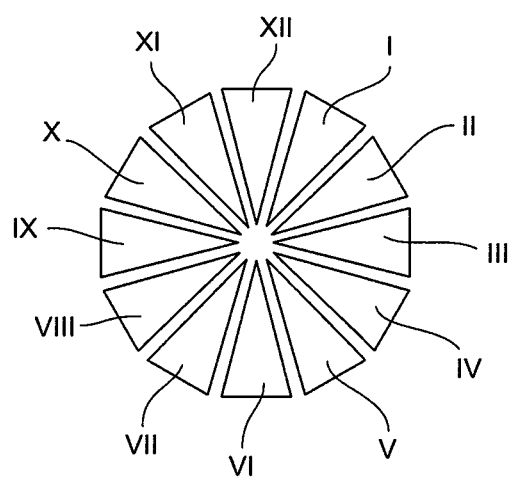
in FIG. 7B, a top plan view of another example of a regular pattern of radiating conductor tracks implanted on a support or surface which can be associated with a touch detection device according to the invention.

FIG. 6D schematically shows yet another circuit having a variable transfer capacitance between path R and ground GND. This amplifier circuit has a first, follower stage comprising a field-effect transistor T1 arrangement where the source-drain channel S1–D1 is in series between a current source I1 and ground GND. The detection path S is applied to the gate G1 of transistor T1 while a capacitor of fixed capacitance CS connects this input path S/G1 to ground GND. Such a stage T1 mounted as a follower reproduces the level of the input path S at output S1 on a branch comprising a variable capacitor C1+C2 in series between S1 and ground GND. The second path formed by the reference path is applied to the regulation terminal between the two capacitors of the variable capacitor C1–C2 via a coupling capacitor Cr. Such a circuit has a fixed capacitance Cs on the input path S and produces a variable transfer capacitance between the reference path R and ground GND.

With respect to the circuits CPB illustrated in FIGS. 1 and 6A, the circuits of FIGS. 6B, 6C and 6D offer the advantage of enabling the variable transfer capacitance to be varied by smaller increments or decrements than what is possible by simply connecting or disconnecting parallel capacitors. Indeed, capacitors cannot be manufactured with a physical size below some physical limit allowed by the manufacturing process and cannot be connected or switched without introducing a minimum amount of parasitic capacitances. On the other hand, varying the transfer capacitance by means, for example, of a gain (amplification or attenuation) amplifier allows to overcome this limit.

In functioning, therefore, the introduction of such circuits that offer a variable capacitive impedance CRb or a variable transfer capacitance in parallel on a path R at an output will add to the value of intrinsic capacitance CRi of this path R and will modify it so that an overall capacitance CR=CRi+CRb is obtained. By controlling or regulating the value of variable capacitance CRb, one can arrive at compensating the capacitive unbalance CS/CR between the paths of detection S and reference R of the touch detection device according to the invention that is associated with the series of conductive tracks of the sensitive surface. One thus arrives at quantifying as a function of the regulation of the variable capacitance or of the value of the digital command of the set of switchable capacitors the value of capacitive unbalance (or of electrostatic charge unbalance) of the coupling of tracks (V-VI) connected with paths P and S (detection) relative to the coupling of tracks (IV-V) connected with the paths P and R (reference).

Such an analog measurement or digital quantification (estimation with discrete values, in particular binary values) will in the first place allow to spot the place where a perturbation occurs, and to discriminate as a function of the value measured or quantified whether it is really a finger or an object, and not any parasitic perturbation.

It may above all permit in addition to define with precision what is the location or exact contours of the body approaching the surface, and possibly to estimate its distance relative to the screen surface plane, since an object farther away will less perturb the electrostatic field lines and coupling between the conductors of the sensitive surface.

The principle of touch detection according to the invention applied to a surface comprising a plurality of conductors distributed according to a regular pattern exhibits particular sensitivity profiles, which moreover vary in an advantageous fashion as a function of the configuration of the paths R, P, and S allocated to the surface conductors.

Figure 8A:
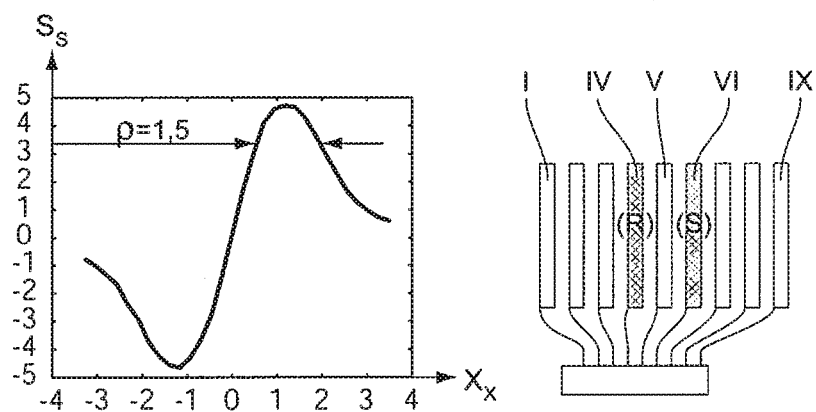

FIG. 8A for example illustrates the sensitivity profile obtained with the first example of a simple configuration of FIG. 1 recalled to the right of the drawing. To recall, in this configuration that is simple and condensed, and symmetric or rather antisymmetric, a central track V is connected with the path of polarization while the two tracks IV and VI immediately neighboring to the left and right are connected to the paths of reference R and detection S, respectively.

The diagram of FIG. 8A then illustrates the diagram of sensitivity Ss obtained as a function of the axial distance Xx relative to the median axis of central track V. One finds that the sensibility profile has the aspect of a sine cycle (rest of the diagram flat) with a maximum of sensitivity at a distance of about Xx=1 corresponding to the pitch of the periodic pattern, therefore toward the top of track VI. The profile peak Ss has a resolution (peak width measured conventionally at max/√2 and expressed in units of the periodicity pitch of the periodic pattern of conductors) corresponding to a width of about 1 to 2 pitches, typically $\rho \approx 1.5$ pitches. Profile Ss of FIG. 8A exhibits an opposite sensitivity maximum at a distance of about Xx=–1 toward the top of the conducting track IV connected with the reference path R. In absolute, this sensitivity profile Ss detects a presence above track IV as well as above track VI.

Figure 8B:
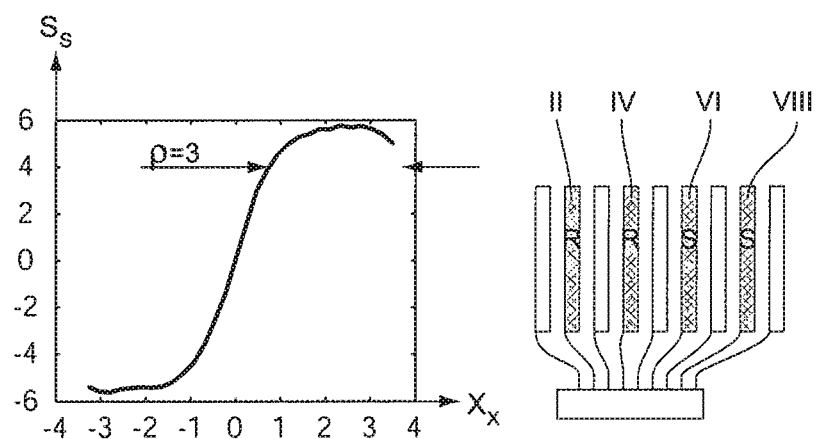

FIG. 8B illustrates another example of sensitivity profile obtained with another, antisymmetric configuration that is indicated to the right of the drawing, in which groups formed by several conductive tracks II-IV-VI-VIII are connected to the two paths of reference and detection, R and S. In the order as illustrated, two tracks in position II and IV are connected to the reference path R in alternation with tracks (I, III, V) connected to the polarization path. Two other tracks in positions VI and VIII are connected to the detection path S in alternation with the tracks (V, VII, IX) connected with the polarization path. The left-side diagram of FIG. 8B indicates a sensitivity profile that was obtained with such a configuration of tracks of reference R, polarization, and detection S. The sensitivity profile of FIG. 8B is notched with a plateau-shaped maximum of sensitivity at the range of distances Xx from 1 to 3, hence above detection tracks S in positions VI and VIII (distance of about Xx=1 and Xx=3). The profile also has, in an antisymmetric manner, an opposite sensitivity plateau in the distance range from Xx=–1 to Xx=–3. Such a configuration with such a sensitivity profile detects the presence of a finger or of an object above the intervals of tracks VI-VII-VIII-(IX), but also on the opposite side above tracks (I)-II-III-IV, which does not offer great resolution but will allow bulky bodies or objects to be detected.

Figure 8C:
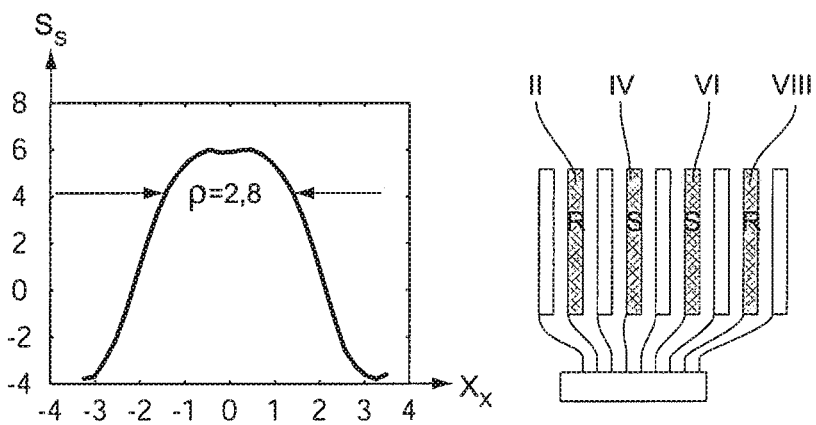

FIG. 8C illustrates another sensitivity profile Ss obtained with yet another, symmetric configuration with two groups of conductive tracks, one in positions II and VIII connected with the reference path R and the other in positions IV and VI connected with the detection path S. The sensitivity profile obtained has the shape of a door with a resolution width ρ between 2 and 3 pitches, typically ρ≈2.8 pitches with a less significant negative sensitivity rebound (value of −4, to compare with the maximum of 6).

It has now been found that in advantageous fashion the control unit that preferably is a microcontroller or microprocessor may combine such configurations and their sensitivity profiles to obtain new detection profiles that are particularly interesting and unexpected.

Figure 9:
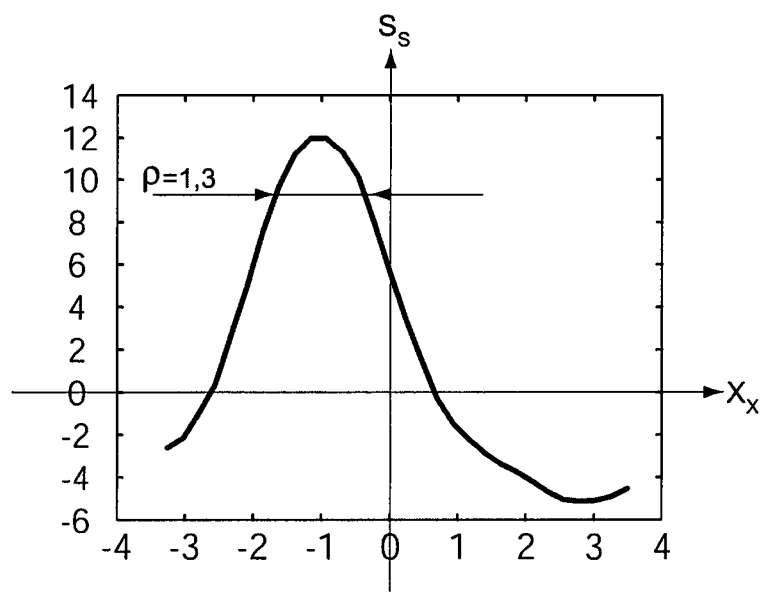
in FIGS. 8A, 8B, 8C, and 9, diagrams of the sensitivity as a function of the touch position relative to the median axis for different particular configurations of a reference track R and a detection track S, and their combination according to the invention.

As an indicative example only, FIG. 9 illustrates the sensibility profile obtained by a linear combination of the sensibility profiles of FIGS. 8A, 8B, and 8C. We consider that the sensitivity profile of FIG. 8A is SA, that of FIG. 8B is SB, that of Figure 8C is SC, while the sensitivity profile of FIG. 9 is SD. The formula for weighted, linear combination in this example is the following, for illustration only:

$$SD = SC - 1.5 \times SA.$$

The sensitivity profile SD of FIG. 9 thus is obtained according to this indicative example by combining the sensitivity profile SC of the configuration of FIG. 8C, and subtracting therefrom 1.5 times the sensitivity profile SA of the configuration of FIG. 8A.

In advantageous fashion, the sensitivity profile SD of FIG. 9 has a narrow sensitivity peak that has no negative counterpart of the same absolute value. In a surprising fashion, its resolution exhibits a width comprised between one pitch and one and a half pitches of the periodic patterns, typically ρ≈1.3 pitches. It can be noted that in an advantageous fashion, such a resolution obtained by linear combination is inferior to ρ≈1.5 pitches, and hence has a sensitivity peak that is narrower than those of the two sensitivity profiles of FIGS. 8A and 8C from which it derives. Moreover, such a sensitivity profile exhibits no opposite peak attaining the same amplitude (absolute value), and thus exhibits a single peak of absolute maximum sensitivity.

It is understood that a multitude, even an infinity of different sensitivity profiles that are advantageous by themselves and adapted to the detection of each shape, dimension, bulkiness, and shape contour may be obtained with such linear combinations of configuration and of sensitivity profiles, by accomplishing additions, substractions, multiplications, weightings, or other elementary arithmetic operations.

It will be noticed that different advantageous configurations and sensitivity profiles can be obtained according to the present teaching, notably dynamic sensitivity configurations and profiles. Namely, a succession of distinct configurations that succeed each other in time and that are centered on one or several moving points will allow a movement of one or several bodies to be detected and discriminated, and notably movements of several fingers or objects and movements relative to one another. As an illustrative example, one may detect a movement of two fingers moving apart or a rotative movement.

Coming back to the circuit of the bank of switchable capacitors that allows to vary a capacitive impedance, or two capacitive impedances applied in parallel to one or two paths, and notably as a function of a capacitive balancing command that has been quantified in a digital and preferably binary way, it now appears that according to an alternative, one may advantageously apply such a variable capacitance circuit to an input of one or two polarization paths defined among a beam of at least three paths that can be connected with at least three conductors or three groups of conductors, according to the principle exposed before.

According to this alternative realization of the invention, the detection device this time has a beam comprising at least three paths, among which a first path of polarization, a second path of polarization, and a third path of detection.

Preferably, the first polarization path is a positive polarization path P+ and the second polarization path is a negative polarization path P−, these two polarization paths being connected to a positive voltage source PSB and to a negative voltage source NSB (see FIG. 11), which are preferably switchable or exchangeable. The voltages of polarization P+ and P− can have opposite values or different absolute values, even values of the same sign provided that their values differ.

Figure 10A:
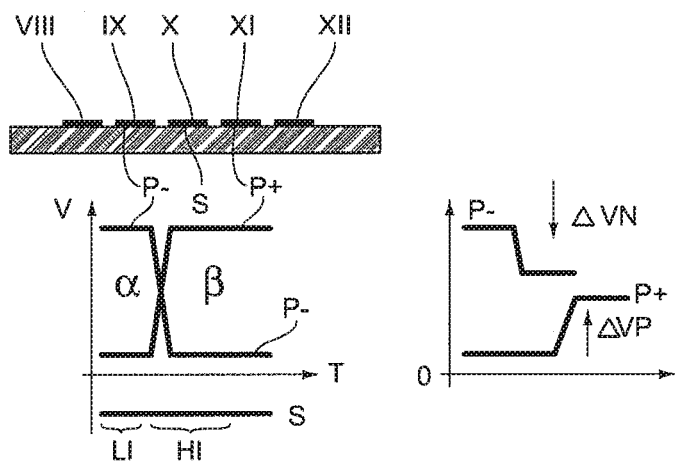
in FIGS. 10A, 10B, and 10C, diagrams of the touch detection principle implemented according to another alternative of realization of the detection device according to the invention where a positive polarization P+ and a negative polarization P− are applied to two conducting tracks, and the electrostatic effect is collected on a detection track S during phases of calibration ($\alpha$) and testing ($\beta$), where

FIG. 10A schematically shows the application of such positive (P+) and negative (P−) polarizations to two lateral tracks IX and XI on the two sides of a central track X (that forms an axis of symmetry) allocated and connected to the detection path S.

The operations of detection occur as previously, by scanning, addressing, multiplexing, switching, and connection of the selected tracks X, XI, and IX with the three respective paths of the beam, that is, with the paths of detection S and of positive P+ and negative P− polarization.

At each touch detection operation, one distinguishes two phases: a first phase α and a second phase β.

Figure 11:
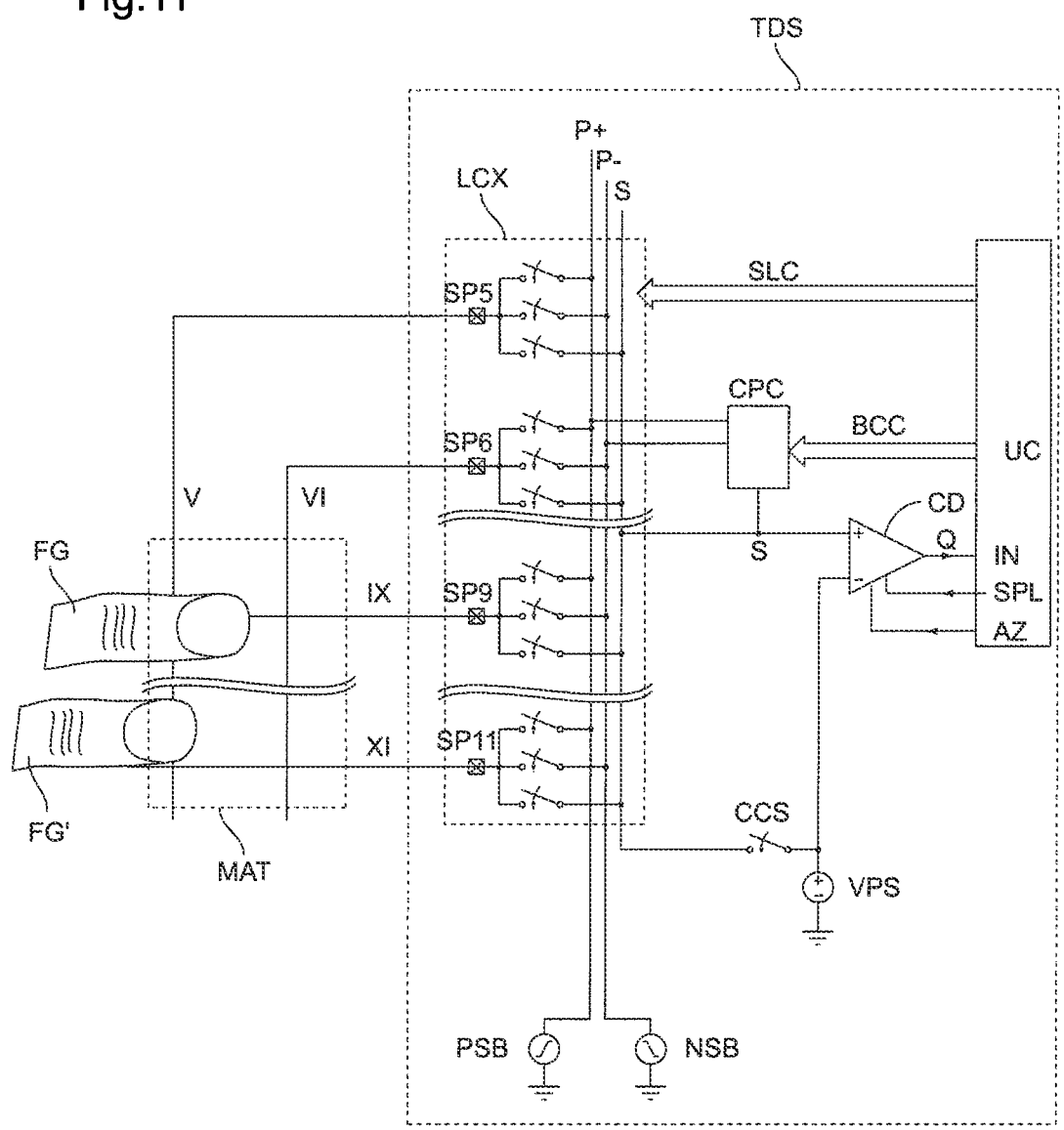
in FIG. 11, a diagram of the functional principle of an electronic circuit according to another realization of the touch detection device associated with a pattern of conductors implanted in two directions, and implementing another detection mode according to the invention.

During the first phase α, the detection path S is set to an established reference potential, for example the ground GND or the potential of a voltage source VPS (for instance a voltage VPS in the middle between voltages P+ and P−, the voltage VPS being ideally zero), to which it is connected by a switch CCS (see FIG. 11). The conductor X and the conductive line S of the detection path are thus in a state considered to be of low impedance LI (relatively slight resistance relative to an established potential). The lines of positive P+ and negative P− polarization can also be set to an established potential, for example connected to the ground GND, and set to a potential of zero, or alternatively interchanged by inverters, as suggested by the chronogram of FIG. 10A, the conductor IX connected with path P− being set to a higher potential than the conductor of path P+ that is set to a lower potential.

In this first phase α, the potential of conductor X of the detection path S is sampled and measured, for instance with a comparator or amplifier circuit CC (see FIG. 11), and will later be used as a reference potential level.

In the second phase β, a positive potential jump ΔVP is applied to the conductor XI of polarization path P+, and a negative potential jump ΔVN is applied to the conductor IX of the other polarization path P−.

The detection path S is then placed in a state considered to be of high impedance HI, the switch CCS being open during this second phase β.

FIG. 10A shows that in the absence of a perturbation (no finger or object present above the surface) the level of potential that is collected on the axial conductive track X connected to the detection path S remains stable and substantially equal to the potential level established earlier during the first phase α. The first electrostatic coupling established between the conductor IX of negative polarization P− and the conductor X of detection S is therefore balanced with respect to the second electrostatic coupling established between the conductor XI of positive polarization P+ and the conductor X of detection S.

Figure 10B:
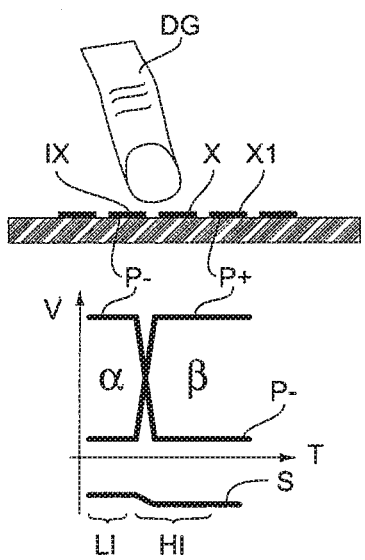

FIG. 10B illustrates a case of tactile approach close to track IX of negative polarization P− and to the electrostatic coupling between conductive tracks IX-X connected to paths P− and S. The potential observed on the axial track X of detection S makes a potential jump between phases α and β. During such a transition the detection path S is disconnected from the established potential VPS and passes from a state of relatively low impedance LI to a state of high impedance HI. The potential jump that has appeared on the detection line S goes in the direction of negative variation of potential ΔVN of the polarization path P− concerned. More precisely, the amplitude of the potential jump on detection path S appears to correspond to the amplitude of capacitive or electrostatic unbalance between the first coupling P−/S and the second coupling P+/S.

Figure 10C:
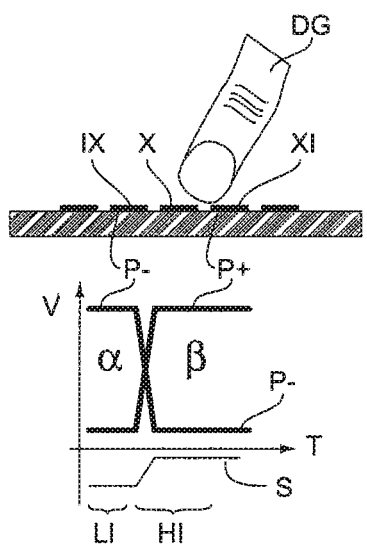

FIG. 10C illustrates another case of tactile approach close to another track XI of positive polarization P+ and to the electrostatic coupling between the conductive tracks X and XI connected to paths S and P+. The potential observed on axial track X of detection S accomplishes a potential jump in a positive direction opposite to that in FIG. 10B, and in the direction of positive potential variation ΔVP of the polarization path P+ concerned. The amplitude of this potential jump of path S corresponds to the amplitude of capacitive or electrostatic unbalance between the second coupling P+/S and the first coupling P−/S.

FIG. 11 shows a functional diagram of an electronic circuit of the touch detection device corresponding to this second alternative.

The circuit of the detection device is associated with a support MAT the surface of which here has two series of conductors . . . , V, VI, . . . and . . . , X, XI, . . . each arranged according to a regular pattern along two perpendicular directions in a plane. The conducting lines . . . , V, VI, . . . and . . . , X, XI, . . . are connected to one or two systems of addressing SLC and selection LCX which allow to individually connect each conductor . . . , V, VI, . . . , X, XI, . . . to the three paths P+, P−, and S of a beam (or possibly two independent vertical and horizontal beams for separate addressing of the rows and columns), according to the principle previously exposed with reference to FIG. 1.

The two polarization paths P+ and P− are connected respectively to two voltage sources PSB and NSB, which provide a square voltage signal of positive polarization P+ and negative polarization P−, respectively. The potential levels P+ and P− may notably be furnished by follower or inverter arrangements with logic gate, and can be switched or exchanged.

The detection path S of the beam is applied to a differential input (here +) of a comparator or amplifier circuit CD the other differential input of which (here the inverting input −) is connected to a voltage source. The two differential inputs + and − are interconnected by a switch CCS (electronic transistor-type switch).

The output Q of the differential circuit CD of comparison of the detection path S with respect to the established reference voltage VPS is applied to the input IN of a control unit UC that can be constituted by a control circuit, a microprocessor or preferably a microcontroller UC. The control unit UC applies commands of calibration AZ (zero setting) and of sampling SPL to the differential comparison circuit CD.

Unlike the first detection and realization mode of FIGS. 1 to 5, a circuit CPC of variable capacitance advantageously formed by a bank of switchable capacitors CPC controlled by the control unit UC is applied between one or each of the two polarization paths P+ and P− and the third, detection path S.

Figure 5:
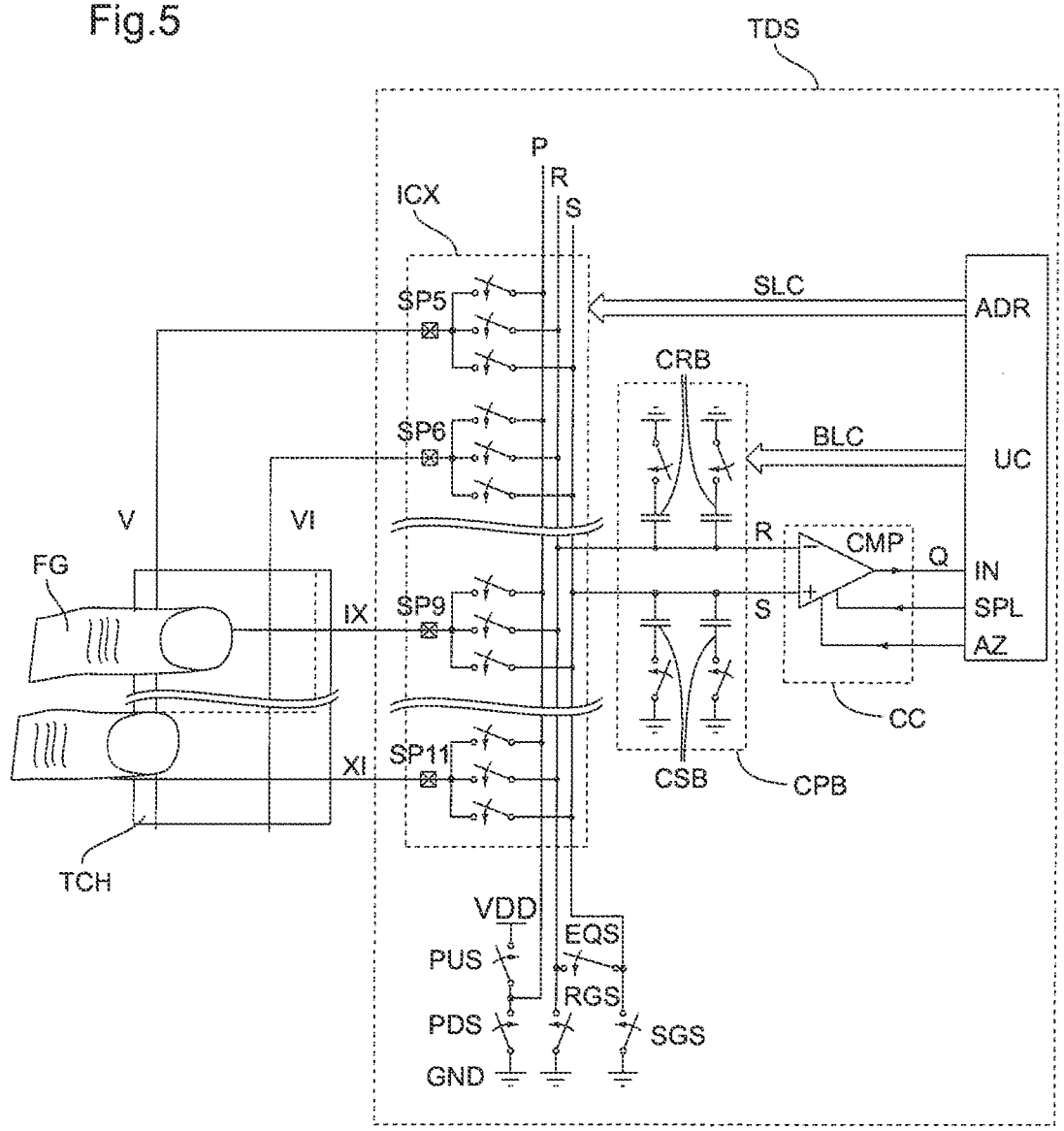
in FIG. 5, a diagram of the functional principle of the electronic circuit of a variant of touch detection device according to the first alternative of the invention, associated with a surface comprising conducting tracks implanted in two directions.
Figure 12A:
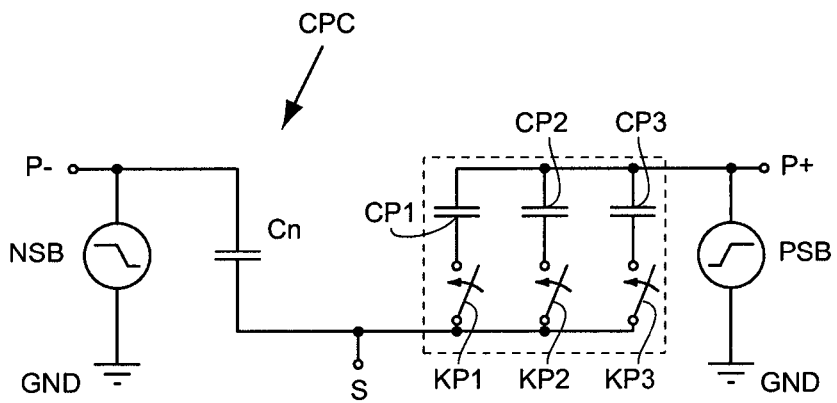
in FIGS. 12A, 12B, and 12C, diagrams of several alternatives of realization of variable transfer capacitance circuits for balancing the three paths P+, P−, and S of a detection device realized according to the alternative of FIG. 11.

More precisely, it is indicated in FIG. 11 and presented in detail in FIG. 12A that unlike the bank of switchable capacitors CPB of FIGS. 1, 5, and 6A, the circuit CPC with a variable capacitance and/or the set of switchable capacitors is connected in parallel between a path of polarization P+ or P− and the reference path S. This circuit that has a variable capacitive impedance (preferably, a capacitance quantified by digital switching) thus establishes a capacitive (re)balancing of the first coupling between the path of positive polarization P+ and the detection path S relative to the second coupling between the path of negative polarization P− and the detection path S.

More precisely, the circuit CPC can be advantageously formed by a bank of switchable capacitors comprising at least one and preferably two batteries of switchable capacitors connected in parallel respectively between one or each of the two paths of polarization P+, P− and the path of detection S. Unlike the bank of switchable capacitors CPB of FIGS. 1, 5, and 6A, as illustrated in FIG. 12A, this new circuit CPC of variable capacitance formed by a set of switchable capacitors, each branch in parallel containing a switch KP1, KP2, KP3, . . . and a capacitor CP1, CP2, CP3, . . . connects one of the polarization paths P+ with the detection path S. The digital (re)balancing command BCC thus modifies the capacitive impedance added in parallel between the polarization path P+ and the detection path S.

It follows that during passage from the first phase α to the second phase β, if the differential detection circuit CD detects a potential jump on the detection path S with respect to the reference potential VPS, and depending on the direction and amplitude of the potential jump, the control unit UC can modify the digital command BCC of switching of the set of switchable capacitors CP1, CP2, CP3, etc. so as to reestablish the capacitive or electrostatic balance of the coupling between the paths P+ and S relative to the second coupling between the paths P− and S.

The detection cycles in two phases α, β of calibration and testing by the differential detection circuit CD will be repeated up to neutralization of the capacitive or electrostatic unbalance between the pairs of paths P+/S and P−/S and up to the disappearance of the potential jumps between the two phases α and β.

The control unit may advantageously control the variation of the capacitive impedance added between the detection path S and the path P+(and/or possibly P−). To this effect, as stated before, the control unit UC increases or decreases the binary digital (re)balancing command BCC that controls the switching of the set of switchable capacitors as a function of the potential jump that is detected and amplified by the differential detection circuit CD. To this effect the output Q of the circuit CD is applied to an input IN of the control unit UC.

Figure 12B:
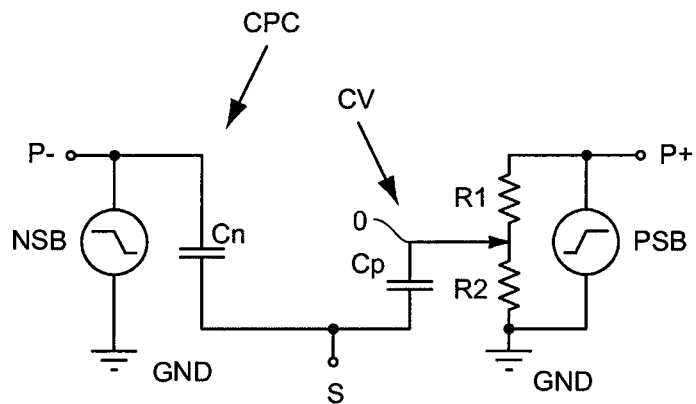

FIG. 12B shows another functional diagram of a circuit furnishing values of variable transfer capacitance Cv between the paths P+ and S and a value of fixed capacitance Cn between the paths P− and S. The branch in parallel between paths P+ and S is formed by a potentiometer of which the end terminals are connected between the ground and the path P+, and of which the intermediate terminal is connected via a coupling capacitor Cp to the detection path S.

Figure 12C:
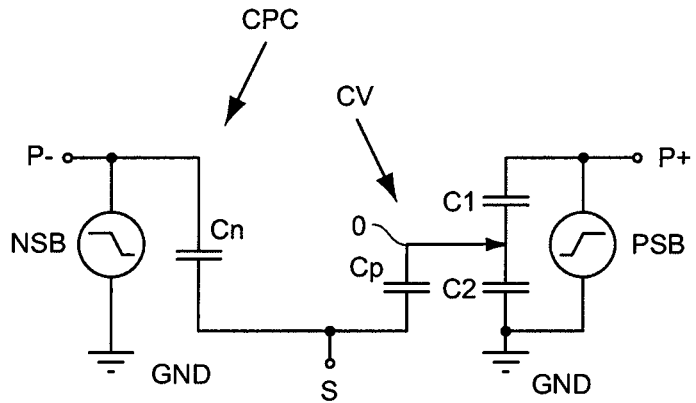

FIG. 12C shows yet another diagram of a circuit of variable capacitance between paths P+ and S and fixed capacitance between paths P− and S. The branch between paths P+ and S contains a capacitor Cp connected between path S and the intermediate terminal of a variable capacitor C1+C2 of which the end plates are connected with ground GND and with path P+, respectively.

Thus, when the differential detection circuit and the control unit detect the appearance of a potential between phases α and β, the control unit can regulate the variable capacitance or transfer capacitance circuit so as to compensate the electrostatic unbalance between the pairs of paths P+/S and P−/S until the unbalance is neutralized. The command of regulating the variable capacitance or transfer capacitance or digital value of the binary command of the set of switchable capacitors having a quantifiable capacitive impedance introduced by the control unit on the paths P+ and/or P− allows to locate and quantify the electrostatic perturbation that has appeared above the interval between the conductors of the touch surface. In this way one can advantageously discriminate parasitic phenomena with respect to the effect of a tactile approach or the presence of a body. The quantification will thus allow the body that is present to be located and recognized. Optionally, the quantitative measure of capacitive unbalance may allow to locate the distance of the body, finger, or object in a direction normal to the surface of the touch support.

Figure 13:
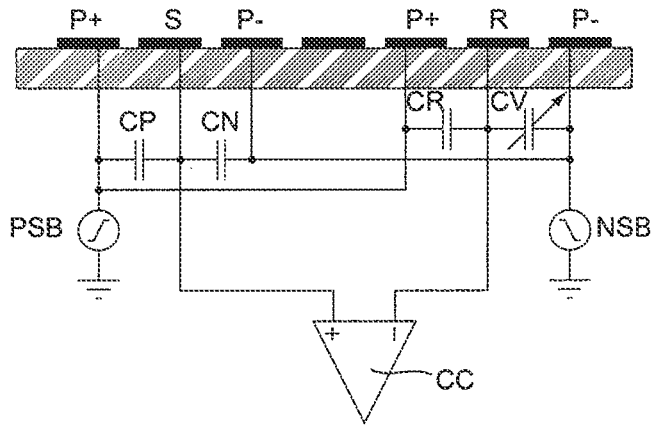
in FIG. 13, a sectional view of a support comprising a series of conducting tracks corresponding to a combination of four paths of positive polarization P+, negative polarization P−, reference R, and detection S to implement an improved detection principle combining the alternative modes of detection of FIGS. 1 to 9 and of FIGS. 10, 11, 12A-C.

Another alternative of detection mode is illustrated by the diagram of FIG. 13. The alternative of realization of FIG. 13 combines the two modes of detection of the first and second alternative. It is foreseen in this mode of detection to allocate functions of positive polarization P+ and negative polarization P− as well as functions of detection S and reference R to at least four, five, or six conductors of the touch detection surface.

According to the configuration example illustrated in FIG. 13, three first conductors are connected respectively with a path of positive polarization P+, a path of detection S, and a path of negative polarization P−. Three other conductors are connected respectively with a path of positive polarization P+, a path of reference R, and a path of negative polarization P−. The paths of positive and negative polarization P+ and P− are polarized respectively by two voltage sources PSB and NSB, as in the former alternative. The two paths of detection S and reference R are applied to a differential comparator or amplifier circuit CC in order to test the electrostatic balance between the detection paths S and R and detect a capacitive unbalance of the couplings of paths S/P+ and P− with respect to the couplings of paths R/P+ and P−.

The paths of polarization P+ and P− are coupled to the path of detection by two capacitors CP and CN of fixed capacitance. The path of positive polarization P+ and the path of reference R are coupled by a capacitor CR of fixed capacitance. The path of negative polarization P− and the path of reference R are coupled by a capacitor CV of variable capacitance controlled by a control unit (not shown). When functioning, when the differential circuit CC comparing the paths S and R detects a capacitive unbalance the control unit acts on the variable capacitance CV in order to compensate such a capacitive unbalance and to quantify it when the unbalance is neutralized.

In advantageous fashion, such an improved detection mode with four paths can be used to establish or conserve a perfect symmetry relative to the set of three paths P+, S, P−. Such a symmetry guarantees a better rejection of the perturbations common to the paths of detection and of reference, S and R, for example the radiation of the electrical supply circuit at a frequency of 50 or 60 Hz and the radioelectric interferences, which a priori have the same effect on tracks that are relatively close, like S and R (advantageous subtraction of common noise between the tracks).

Now the invention foresees and allows to combine advantageously a touch detection device with the matrix addressing circuit of a matrix display screen, particularly one with thin-film transistors TFT.

Figure 14:
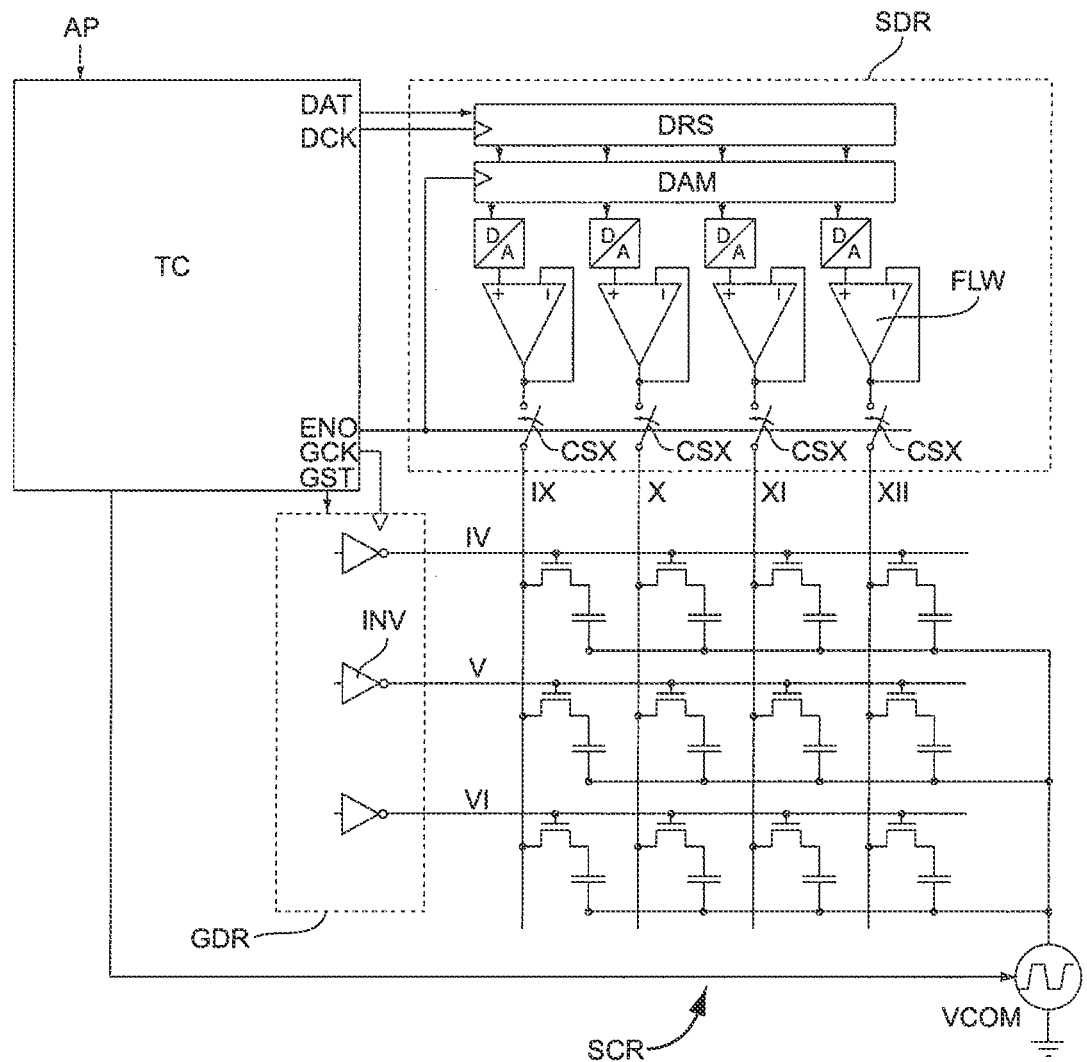
in FIG. 14, a plan view of the structure of the conductive rows and columns under the surface of a flat TFT screen of known type.

FIG. 14 recalls schematically the matrix structure of a TFT addressing circuit of such a matrix screen.

The circuit has a time controller TC and an array of conducting columns . . . , IX, X, XI, XII, . . . and rows . . . , IV, V, VI, . . . interlaced vertically and horizontally on two levels, without contact. Between these lines are interconnected metal-oxide-semiconductor field-effect transistors (MOSFET). More precisely, the columns consist of transparent conductor materials constituting the conductive rows of addressing of the sources, that is, controlling the selection of the transistor sources. The horizontal conducting rows are subdivided into gate addressing lines, i.e., they control the selection and activation of the transistor gates of the row so that they become passing, and into drain lines. The drains of the transistors are connected individually via a charge storage capacitance (memory point) with the corresponding common drain line.

The base panel of the TFT screen also comprises a source addressing driver SDR that controls the set of vertical conducting lines of columns . . . , IX, X, XI, XII, . . . . This source driver SDR consists of a shift register DRS that receives in series the data DAT to be displayed and transmits them via a parallel port to a parallel data buffer DAM which restores them at each clock stroke DCK to the conducting lines of the columns . . . , IX, X, XI, XII, . . . via a follower stage FLW comprising amplifier circuits . . . , FLIX, FLX, FLXI, etc.

The series of conducting lines . . . , IV, V, VI, . . . also has a gate driver (addressing, selection, and activation).

In function, the data accumulated in series by the register DRS are shifted and at each clock stroke DCK retransmitted to the respective columns by the circuits DRS, DAM, DAC, and FLW. Activation of the line of gate . . . IV, V or VI . . . by the gate addressing driver allows the transistor to become passing and allows to store in the plates of the corresponding capacitance the state of the data bits, i.e., of the pixels to display. A line of supply VCOM that is common to all drain lines brings the potential of the other capacitor plates to an elevated potential. The difference of potential of the plates of each capacitor is applied to a liquid-crystal display cell. The potentials applied to the liquid crystals influence the polarization of the light that traverses these liquid crystals. By traversing one or several polarizing filters situated in parallel planes, the light beam transmitted by each cell has its intensity modulated, and may become extinguished or switched on as a function of its polarization. The potential that is applied to the transistor and to the capacitor of each cell makes this cell more or less translucent or opaque, and allows it to transmit or not a pixel of colored light.

Now, according to the invention, it is foreseen to combine the touch detection device with the matrix addressing device of such a TFT screen in order to form in surprising fashion a new display screen system that is provided with functions of touch detection that will permit to detect a tactile approach or the presence of a body next to the outer surface of the TV display screen.

Figure 15:
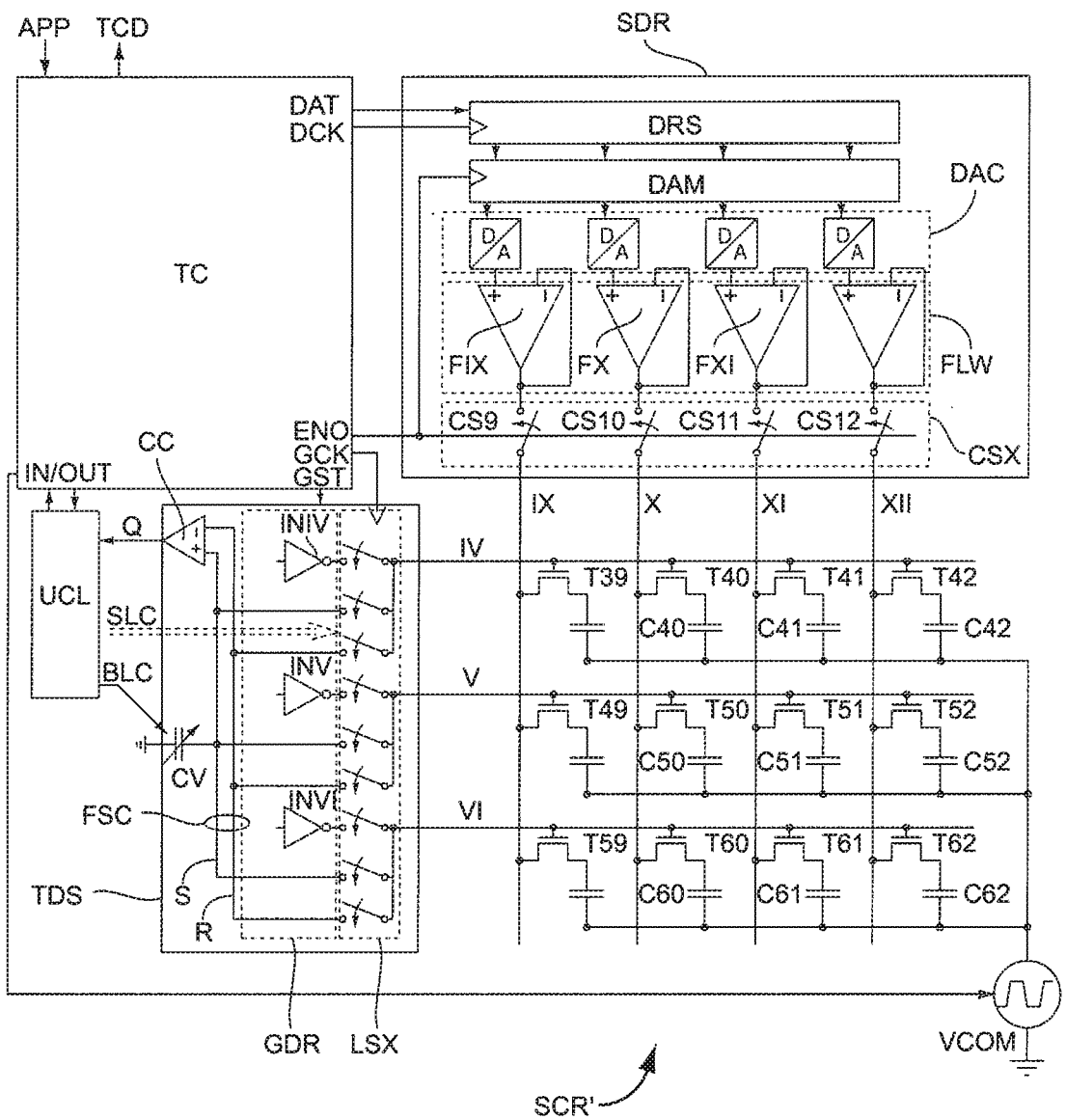
in FIG. 15, a diagram of the connection (implantation) and combination of a touch detection device according to the invention on the conductive rows of a TFT display screen, in order to transform this screen into one having touch detection functions in one dimension (1D touchscreen) according to the invention.

FIG. 15 shows the combination of the touch detection device TDS according to the invention with a matrix circuit of addressing of the gate lines GDR of such a TFT screen, to form a tactile screen system that will detect the approach of a finger, body, or object by indicating its position transverse to the lines (detection of the vertical coordinate, considered as one-dimensional 1D even though it occurs over the entire 2D surface of the display screen). The paths of the touch detection device according to the invention are connected with the lines . . . , IV, V, VI, . . . of control of the gates of the transistors . . . , T39, T40, T41, . . . , T62 etc., so as to apply the functions of polarization, reference, and detection P, R, S and/or P+, S, P− foreseen according to the mode of detection of the invention applied to the gate lines of the screen matrix grid. In the example of FIG. 15, the beam FSC may simply have two paths of reference and detection, R and S, connected with the differential inputs + and − of the comparison circuit CC, while the switching of the path of polarization P between two potential levels VP1 and VP2 (see up, FIG. 3) uses in advantageous fashion (see the inverse phases φ1 and φ2 in the chronograms 4B and 4C) the inverser circuits . . . , INIV, INV, INVI, . . . existing originally in the gate drivers GDR. Other arrangements with several paths S and/or R and/or P and/or P+ and P− (beams with two, three, four, five, or six paths) can be envisaged. The terminals (sensing pins) . . . , SP4, SP5, SP6, . . . (cf. FIGS. 1, 5, and 11) of the addressing or multiplexing circuit ICX for the three paths of the device TDS according to the invention are connected downstream of the gate drivers GDR with inverter and follower arrangements . . . , INIV, INV, INVI, . . . that control the gate lines . . . , IV, V, VI, . . . . The paths R and S of the beam FSC are connected with one or two circuits of variable capacitance CV and with the differential inputs + and − of the differential circuit CC of detection of the capacitive unbalance of the couplings between the paths. The control unit UCL receives the output Q of the differential circuit CC, and controls the addressing SCL of the multiplexing circuit LSX and the selection of the conducting lines . . . , IV, V, VI, . . . connected with the paths of beam FSC.

In this example of application and combination of the touch detection device one obtains a TFT-type matrix display screen equipped with touch detection functions and transformed in a surprising manner into a touchscreen. Such a screen system notably detects a tactile approach or the presence of an object or generally of condensed bodies, and has a sensitivity in the direction(s) transverse to the gate lines. In this way one can spot and precisely locate a finger, an object, or a condensed body along the vertical direction of FIG. 15, or in a direction normal to the sheet turned toward the reader.

Figure 16:
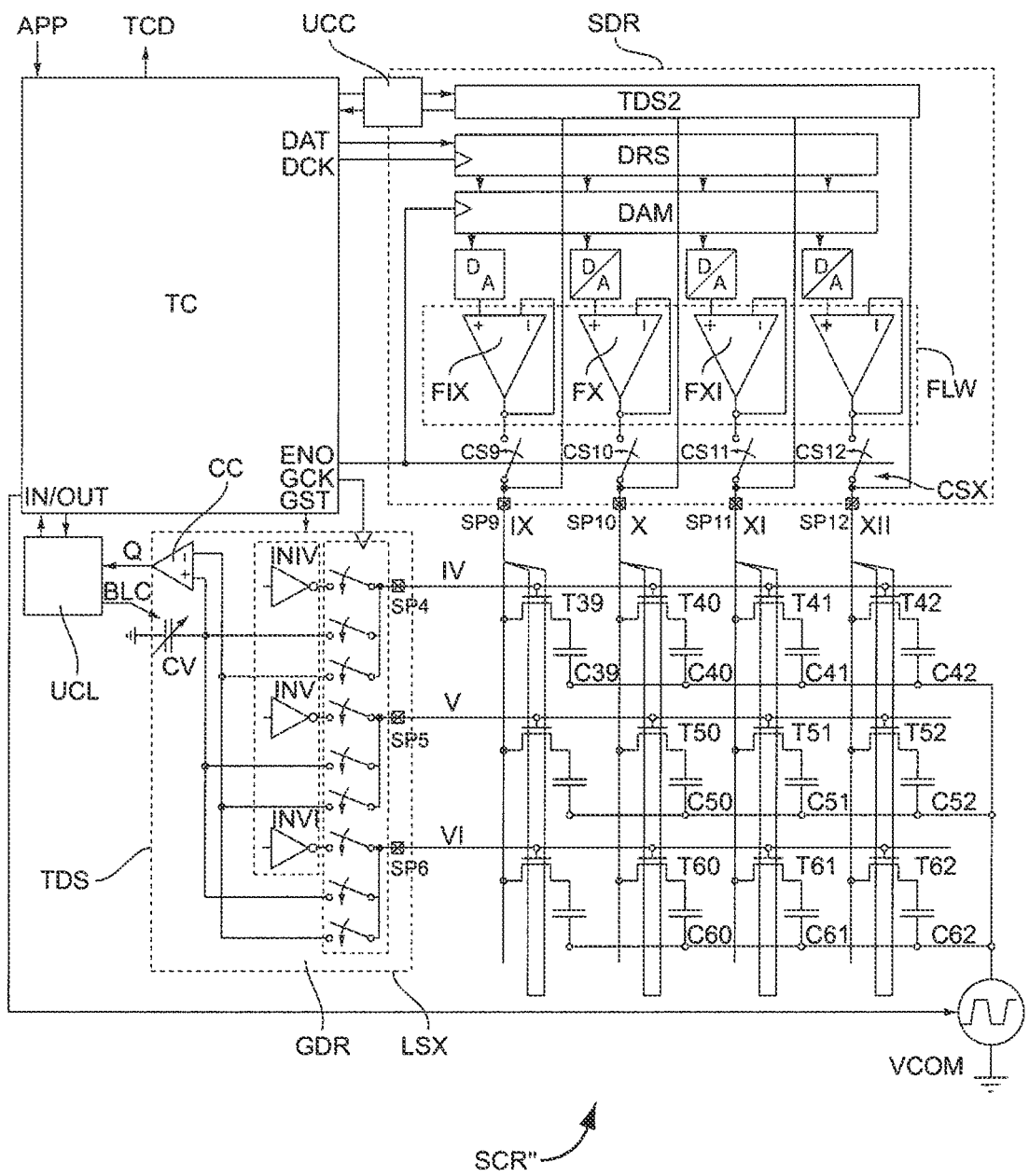
in FIG. 16, a diagram of the connections and combination of a touch detection device on the conducting rows and columns of a TFT screen, to transform this screen into a 2D touchscreen by virtue of the invention.

In a second example of implementation of a matrix display screen of FIG. 16, one obtains advantageously in yet a more surprising manner a tactile screen capable of detecting and spotting the position of a tactile approach or the presence of a body relative to the two dimensions of the surface/plane of the screen, and possibly its distance in a third direction normal to the plane of FIG. 16.

To this end, the series of gate lines . . . , IV, V, VI, . . . of the matrix screen is combined and connected with the respective terminals . . . , SP4, SP5, SP6, . . . of the addressing/multiplexing circuit ICX of a first detection device TDS according to the invention, as exposed hereinbefore with respect to FIG. 15, to accomplish the detection and spotting of position in at least one dimension, 1D or 2D, in the direction transverse to lines IV, V, VI (the vertical of FIG. 16 and usually of the screen). A second touch detection device TDS is combined and connected to the lines of columns . . . , IX, X, XI, XII, . . . of control of the transistor sources of the transistors of the TFT matrix screen. The function of this second touch detection device TDS2 consists in accomplishing the detection and position spotting of a finger, an object, or more generally any condensed body in one or two dimensions, 1D or 2D, in the one or two directions transverse to the lines of columns . . . , IX, X, XI, XII, . . . of control of the sources of transistors . . . , T39, . . . , T40, T50, T60, . . . (conventional horizontal direction(s) and normal direction relative to the plane of FIG. 16 and usually to the screen). This second detection device TDS2 has a control unit UCC that is separated or common with the first detection device TDS. The conducting lines . . . , IX, X, XI, XII, . . . of the columns of control of the TFT transistor sources are connected with the respective terminals . . . , SP9, SP10, SP11, SP12, . . . of the addressing and multiplexing circuits CSX of the touch detection device according to the invention.

Figure 17:
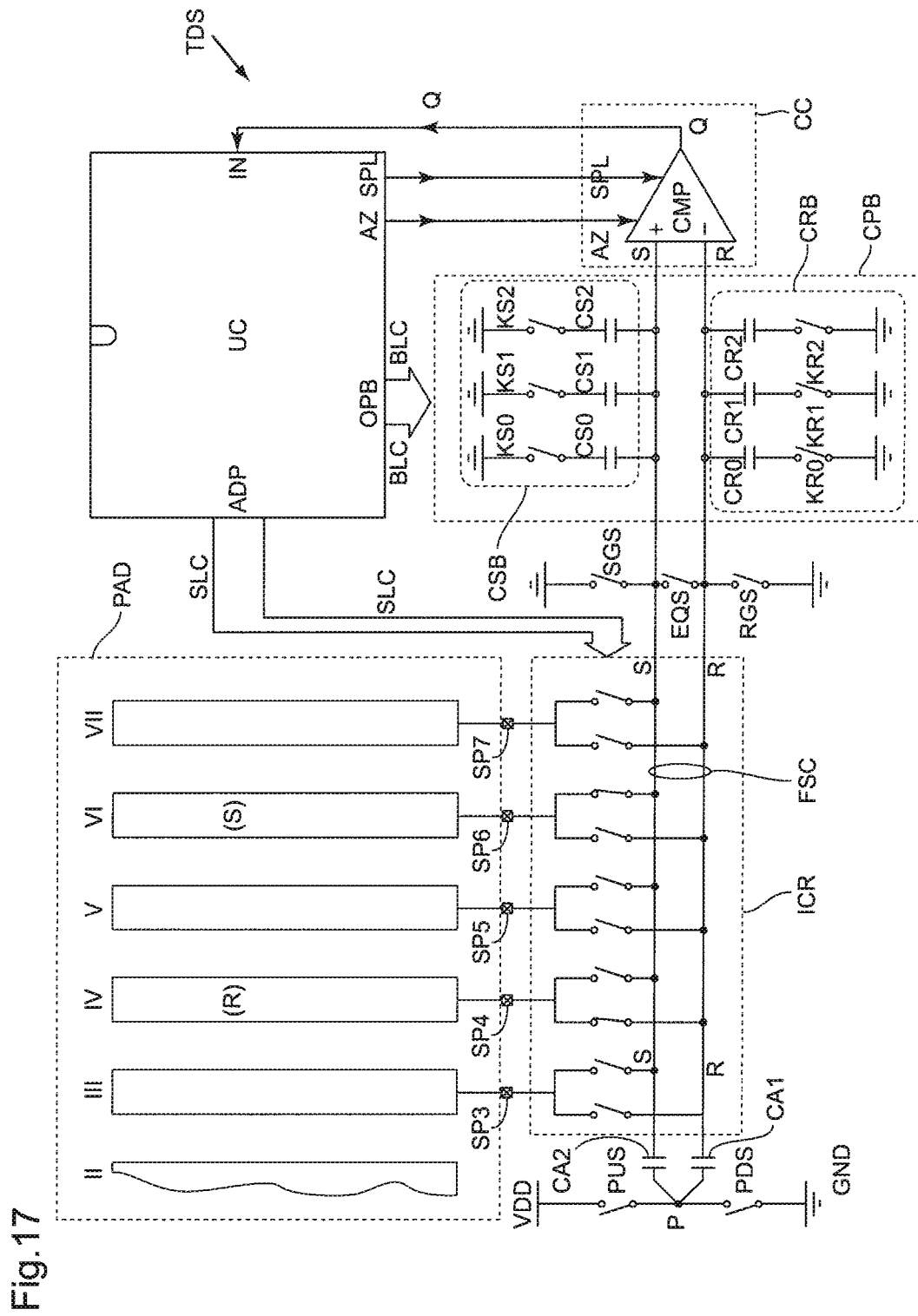
in FIG. 17, a functional diagram of the principle of an electronic circuit of another realization of a touch detection device according to the invention, associated with a conductor pattern.

FIG. 17 shows a touch detection device TDS according to another embodiment of the invention. This device differs from the one illustrated in FIG. 1 in that the polarization path P and the corresponding switches of the addressing circuit ICX which permitted to connect this path of polarization P with the conductors or electrodes . . . II . . . VII . . . of the touch surface PAD have been omitted. Thus, in the embodiment of FIG. 17 the path of polarization P is reduced to a node or point of polarization P, whose potential can be changed from a fixed potential (for example zero, GND) to another fixed potential VDD and inversely, and which is not connected directly to the conductors . . . II . . . VII . . . but is connected to the path of reference R via a capacitor CA1 and to the path of detection S via another capacitor CA2. The device TDS of FIG. 17 functions in the same manner as that illustrated in FIG. 1, except that at each operation of detection (during the scan of the touch surface PAD) the addressing circuit (designed by ICR) will only select two conductors (IV and VI, in the configuration illustrated) or two groups of conductors by connecting them with paths R and S, respectively. In particular, the polarization node P is polarized in the same manner as the polarization path P of the device illustrated in FIG. 1, and the comparison circuit CMP with the control unit UC and the variable capacitance circuit CPB or another variable transfer capacitance circuit will detect and quantify an unbalance between the paths R and S that is caused by the polarization node P and by the presence of a finger or object near the conductors of the touch surface PAD.

Figure 18:
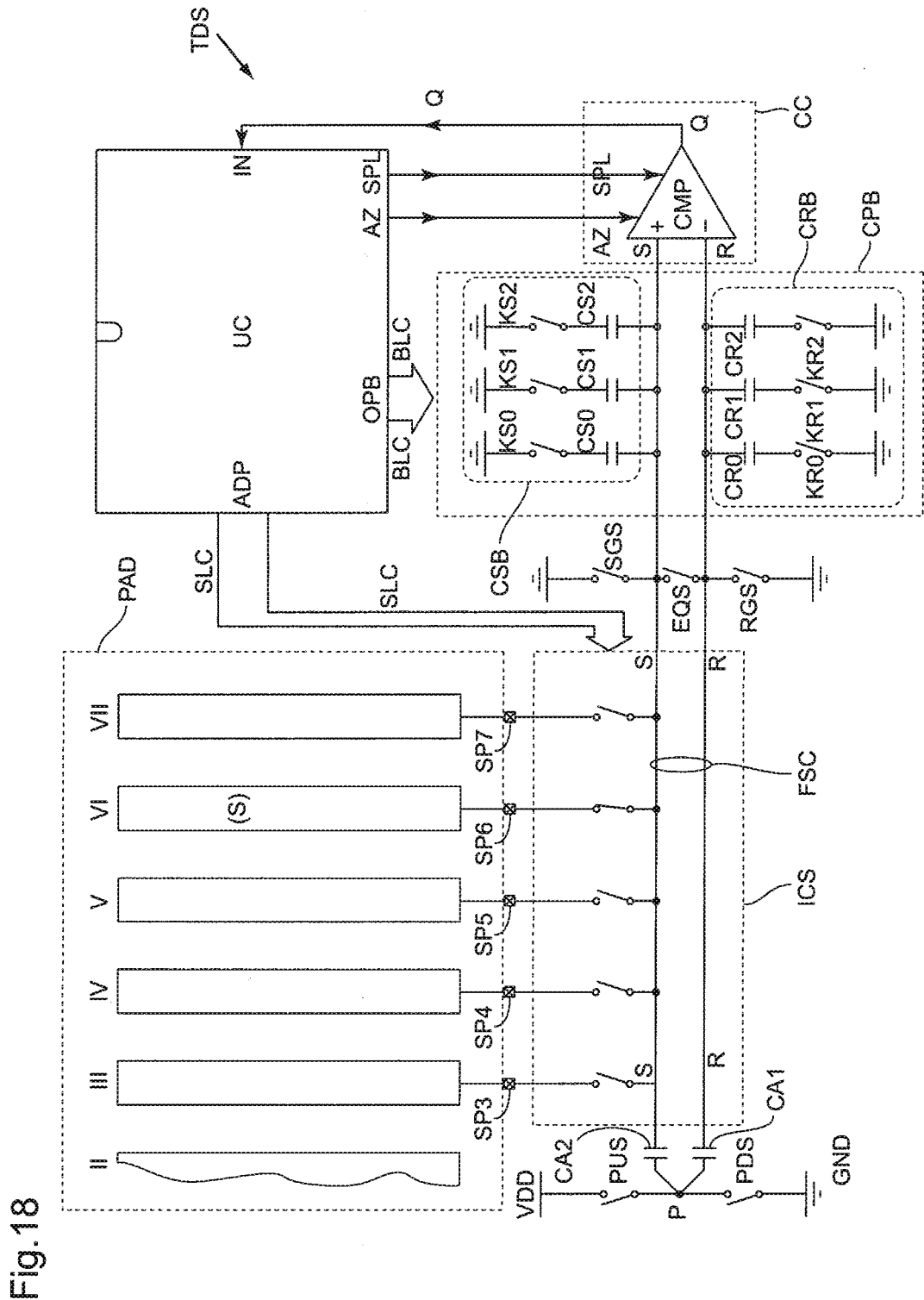
in FIG. 18, a functional diagram of the principle of an electronic circuit of yet another realization of a touch detection device according to the invention, associated with a conductor pattern.

FIG. 18 shows a touch detection device TDS according to yet another embodiment of the invention. This device differs from the one illustrated in FIG. 17 in that the switches of the addressing circuit ICR which permitted to connect the paths of reference R to the conductors . . . II . . . VII . . . have been suppressed. In other terms, the addressing circuit designed by ICS will only select one conductor (the conductor VI in the configuration illustrated) or one group of conductors by connecting it to the detection path S. Apart from this difference, the device TDS illustrated in FIG. 18 functions in the same manner as those illustrated in FIGS. 1 and 17. In particular, the node of polarization P connected to the path R via a capacitor CA1 and to the path S via a capacitor CA2 is polarized in the same manner as the path of polarization P of the device illustrated in FIG. 1, and the comparison circuit CMP with the control unit UC and the variable capacitance circuit CPB or another variable transfer capacitance circuit detect and quantify an unbalance between paths R and S that is caused by the polarization of node P and by the presence of a finger or object close to the conductors of the touch surface PAD.

Figure 19:
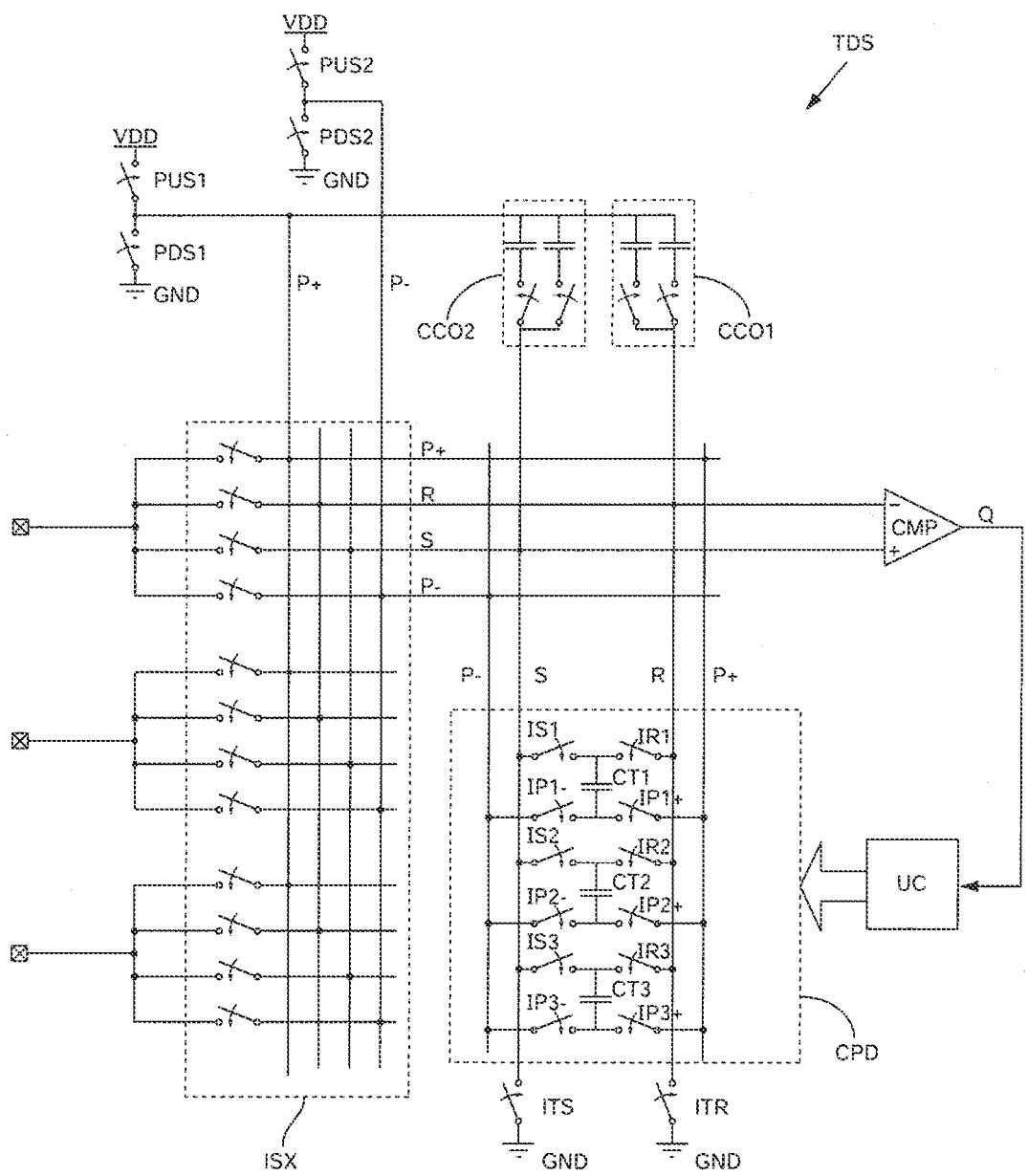
in FIG. 19, a functional diagram of the principle of an electronic circuit of yet another realization of a touch detection device which is able to implement several detection modes according to the invention.

FIG. 19 shows a touch detection device TDS according to yet another embodiment of the invention. In this device four paths are provided, namely two paths of polarization P+ and P−, one path of reference R, and one path of selection S. An addressing circuit ISX can connect these paths P+, P−, R, and S with conductors of a touch surface of the type of surface PAD represented in the previous figures. The paths P+, P−, R, and S are connected with a variable capacitance circuit CPD. The variable capacitance circuit CPD comprises for instance several capacitors CT1, CT2, CT3, . . . , where each capacitor CTi has a first terminal connected with path R via a switch IRi and with path S via a switch ISi, as well as a second terminal connected with path P+ via a switch IPi+ and with path P− via a switch IPi−. The path P+ is connected to a polarizing potential VDD via a switch PUS1 and to the ground GND via a switch PDS1. The path P− is connected to a polarizing potential VDD via a switch PUS2 and to the ground GND via a switch PDS2. The path R is connected to a first input (here the input −) of a comparator CMP, and via a switch ITR to the ground GND. The path S is connected to a second input (here the input +) of the comparator CMP, and via a switch ITS to the ground GND. The path R is also connected to the path P+ via first switchable capacitive means CCO1 constituted for example by a capacitor in series with a switch or by several parallel sets of a capacitor in series with a switch. The path S is also connected to path P+ via second switchable capacitive means CCO2 constituted for example by a capacitor in series with a switch or by several parallel sets of a capacitor in series with a switch. Finally, as in the prior embodiments, the output Q of the comparator CMP is connected with a control unit UC. The control unit UC controls the variable capacitance circuit CPD, the addressing circuit ISX, the polarization means PUS1 and PDS1, the polarization means PUS2 and PDS2, the switches of the capacitive means CCO1 and CCO2, and the switches ITR and ITS.

The device illustrated in FIG. 19 may operate according to different modes that can be selected by the control unit UC, namely:

a first mode in which path P− is permanently connected with the ground (switch PDS2 closed, switch PUS2 open), path P+ is the unique path of polarization, and the switches of the capacitive means CCO1 and CCO2 are open. In this first mode, the device TDS uses the same touch detection principle as the device illustrated in FIG. 1. At each detection operation, three conductors or groups of conductors of the touch surface PAD are selected by the addressing circuit ISX which connects them with paths P+, R, and S, respectively. Here the polarization means PUS1, PDS1 serve to set the path P+, and thus the conductor(s) to which it is connected, to a potential of zero during a first phase $\phi 1$ and to the potential of polarization VDD during a second phase $\phi 2$. The switches ITR and ITS here serve to set the paths R and S, and hence the conductors to which they are connected, to a potential of zero and hence to a zero potential difference between them during the phase $\phi 1$, and to leave the potentials of paths R and S, and hence of the corresponding conductors, floating during the second phase $\phi 2$ (cf. FIGS. 3 and 4). The comparison circuit CMP with the control unit UC and the variable capacitance circuit CPD detect and quantify an unbalance between the potentials of paths R and S that is caused by the polarization of path P+ (phase $\phi 2$) and by the presence of a finger or object close to the conductors of the touch surface;

a second mode in which the path R is permanently connected to the ground (switch ITR closed) and the switches of the capacitive means CCO1 and CCO2 are open. In this second mode, the device TDS uses the same principle of touch detection as the device illustrated in FIG. 11. At each detection operation, the addressing circuit ISX selects three conductors or groups of conductors, by connecting them respectively with paths P+, P−, and S. The means of polarization PUS1, PDS1 here serve to bring path P+, and hence the corresponding conductor(s), to a zero potential during a first phase $\alpha$, and to the potential of polarization VDD during a second phase $\beta$. The means of polarization PUS2, PDS2 here serve to bring path P− and hence the corresponding conductor(s) to a potential of polarization VDD during the first phase $\alpha$ and to a zero potential during the second phase $\beta$. The switch ITS here serves to bring path S, and hence the corresponding conductor(s), to a zero potential during the first phase $\alpha$, and to leave the potential of path S and of the corresponding conductor(s) floating during the second phase $\beta$. The comparison circuit CMP with the control unit UC and the variable capacitance circuit CPD detect and quantify an unbalance between the potential of path S and the zero potential of path R that is caused by the polarization of paths P+ and P− (phase $\beta$) and by the presence of a finger or object close to the conductors of the touch surface;

a third mode in which path P− is permanently connected with the ground (switch PDS2 closed, switch PUS2 open), path P+ is the unique path of polarization, and the switches of the capacitive means CCO1 and CCO2 are closed. In this third mode the device TDS uses the same principle of touch detection as the device illustrated in FIG. 17. Thus, only two conductors or groups of conductors of the touch surface are selected at each detection operation by connecting them to the paths R and S, respectively. The operation of the device TDS is the same as in the first mode, except for the fact that only two conductors or groups of conductors of the touch surface are selected and that the switches of the capacitive means CCO1 and CCO2 are closed. In a variant of this third mode, the device TDS uses the same principle of touch detection as the device used in FIG. 18. In this case, only one conductor or group of conductors of the touch surface is selected at each operation of detection by connecting it to path S. Apart from the fact that only one conductor or group of conductors of the touch surface is selected and that the switches of the capacitive means CCO1 and CCO2 are closed, the operation of the device TDS in this variant of the third mode is the same as in the first mode.

The switches IRi, ISi, IPi+, and IPi− of the variable capacitance circuit CPD allow the latter to take different configurations adapted to the three operation modes of the device TDS hereinabove, and to vary the capacitance of the circuit CPD.

In the first and third operation mode of the device TDS, the switches IPi− are always closed and the switches IPi+ are always open, so that the corresponding terminal of the capacitors CTi is always connected to the ground. By leaving open the switches ISi and closing one or several switches IRi, one adds a capacitance between the path R and the ground, which capacitance is equal to the sum of the respective capacitances of the capacitors CTi whose switch IRi is closed. By leaving the switches IRi open and by closing one or several switches ISi, one adds a capacitance between the path S and the ground, which capacitance is equal to the sum of the respective capacitances of the capacitors CTi whose switch ISi is closed. Thus, when an unbalance appears between paths R and S, the capacitance between path R and the ground or between path S and the ground can be modified as a function of the result produced by the comparator CMP up to compensation of the unbalance.

In the second operation mode of the device TDS, the switches IRi are always open and the switches ISi are always closed. By closing one or several of the switches IPi+ and/or one or several of the switches IPi− one can add a capacitance between the path S and at least one of the paths P+ and P−, which capacitance has a value that depends on the number of switches IPi+ and/or IPi− that are closed. Thus, when an unbalance appears between path R connected to the ground and path S, the capacitance between path S and at least one of the paths P+ and P− can be modified as a function of the result produced by the comparator CMP up to compensation of the unbalance.

The device illustrated in FIG. 19 thus allows to choose the most appropriate mode of detection depending on the conditions under which the touch detection must be performed or on the detection accuracy required.

In all embodiments described hereinabove, the conductors preferably are disposed on the touch surface according to a regular pattern. This is however not indispensable.

Other applications, utilizations, combinations, variants, modes of realization and improvements will appear to one skilled in the art without leaving the frame of the current invention, the scope of the protection being defined in the claims that follow.

The invention claimed is:

1. System for detecting and locating a tactile approach or the presence of a body close to a surface (PAD, TCH) comprising at least one series of conductors (II, III, IV, V, VI, VII and VIII, IX, X, XI, XII) arranged in at least one plane, wherein the surface comprising such a plurality of conductors is associated with a touch detection device (TDS) comprising:
   a polarization path (P), a reference path (R) and a detection path (S),
   addressing means (ICX) for selecting among said plurality of conductors (..., IV, V, VI, ..., IX, X, XI, ...) at least one first conductor (V) by connecting it to the polarization path (P), at least one second conductor (IV) by connecting it to the reference path (R) and at least one third conductor (VI) by connecting it to the detection path (S),
   means (PUS, PDS) for polarizing the polarization path (P), and
   a device for detecting and quantifying an unbalance between the reference path (R) and the detection path (S) caused by the polarization of the polarization path (P) and by the tactile approach or presence of the body, in order to detect and locate the tactile approach or presence of the body,
   wherein said device for detecting and quantifying said unbalance comprises:
      comparison means (CC) receiving at respective inputs the reference and detection paths (R, S);
      variable transfer capacitance means (CPB) connected to at least one of the reference and detection paths; and
      a control unit (UC) connected between the comparison means and the variable transfer capacitance means and adapted to vary the variable transfer capacitance of said variable transfer capacitance means as a function of the result (Q) produced by the comparison means up to compensation of the unbalance.

2. System according to claim 1, wherein the touch detection device (TDS) is adapted to perform the following steps:
   a) set the polarization path (P) to an established potential (GND) and the reference and detection paths (R, S) to an established potential difference, e.g. zero, between them;
   b) apply a polarization (VDD) to the polarization path (P) to change its potential;
   c) compare the potentials of the reference and detection paths (R, S) to detect a variation in the difference of these potentials caused by the polarization of the polarization path (P) and by the tactile approach or presence of the body;
   d) as a function of the result (Q) of the comparison, vary the variable transfer capacitance of said variable transfer capacitance means up to compensation of said variation in the difference of potentials between the reference and detection paths (R, S).

3. System for detecting and locating a tactile approach or the presence of a body close to a surface (PAD, TCH) comprising at least one series of conductors (II, III, IV, V, VI, VII and VIII, IX, X, XI, XII) arranged in at least one plane, wherein the surface comprising such a plurality of conductors is associated with a touch detection device (TDS) comprising:
   a first polarization path (P+), a second polarization path (P−) and a detection path (S),
   addressing means (LCX) for selecting among said plurality of conductors (..., IV, V, VI, ..., IX, X, XI, ...) at least one first conductor by connecting it to the first polarization path (P+), at least one second conductor by connecting it to the second polarization path (P−) and at least one third conductor by connecting it to the detection path (S),
   means (PSB, NSB) for polarizing the polarization paths (P+, P−), and
   a device for detecting and quantifying an unbalance between the detection path (S) and a reference potential path (VPS) caused by the polarization of the polarization paths (P+, P−) and by the tactile approach or presence of the body, in order to detect and locate the tactile approach or presence of the body,
   wherein said device for detecting and quantifying said unbalance comprises:
      comparison means (CD) receiving at respective inputs the detection and reference potential paths (S, VPS);
      variable transfer capacitance means (CPC) connected between one or each of the polarization paths (P+, P−) and the detection path (S); and
      a control unit (UC) connected between the comparison means and the variable transfer capacitance means and adapted to vary the variable transfer capacitance of said variable transfer capacitance means as a function of the result (Q) produced by the comparison means up to compensation of the unbalance.

4. System according to claim 3, wherein the touch detection device (TDS) is adapted to perform the following steps:
   a) set the polarization paths (P+, P−) to respective potentials and the detection path (S) to said reference potential (VPS),
   b) polarize the polarization paths (P+, P−) by applying to them potential variations in opposite directions,
   c) compare the potential of the detection path (S) with the reference potential (VPS) to detect a possible potential jump on the detection path (S) caused by the polarization of the polarization paths (P+, P−) and by the tactile approach or presence of the body,
   d) depending on the comparison result (Q), vary the variable transfer capacitance of said variable transfer capacitance means (CPC) up to compensation of said potential jump on the detection path (S).

5. System according to claim 4, wherein the touch detection device (TDS) is adapted to perform cycles, each cycle comprising the steps a) to c) and a step of variation of the variable transfer capacitance, these cycles being performed until said potential jump on the detection path (S) is compensated.

6. System for detecting and locating a tactile approach or presence of a body close to a surface (PAD, TCH) comprising at least one series of conductors (II, III, IV, V, VI, VII and VIII, IX, X, XI, XII) arranged in at least one plane, wherein the surface comprising such a plurality of conductors is associated with a touch detection device (TDS) comprising:
   a polarization node (P), a reference path (R) and a detection path (S), the polarization node (P) and the reference path (R) being connected to each other by first capacitive means (CA1), the polarization node (P) and the detection path (S) being connected to each other by second capacitive means (CA2),
   addressing means (ICR) for selecting among said plurality of conductors (..., IV, VI, VI, ..., IX, X, XI, ...) at least one first conductor by connecting it to the reference path (R) and at least one second conductor by connecting it to the detection path (S),
   means (PUS, PDS) for polarizing the polarization node (P), and
   a device for detecting and quantifying an unbalance between the reference path (R) and the detection path (S)

caused by the polarization of the polarization node (P) and by the tactile approach or presence of the body, in order to detect and locate the tactile approach or presence of the body, wherein said device for detecting and quantifying said unbalance comprises:

comparison means (CC) receiving at respective inputs the reference and detection paths (R, S);

variable transfer capacitance means (CPB) connected to at least one of the reference and detection paths; and a control unit (UC) connected between the comparison means and the variable transfer capacitance means and adapted to vary the variable transfer capacitance of said variable transfer capacitance means as a function of the result (Q) produced by the comparison means up to compensation of the unbalance.

7. System for detecting and locating a tactile approach or the presence of a body close to a surface (PAD, TCH) comprising at least one series of conductors (II, III, IV, V, VI, VII and VIII, IX, X, XI, XII) arranged in at least one plane, wherein the surface comprising such a plurality of conductors is associated with a touch detection device (TDS) comprising:

a polarization node (P), a reference path (R) and a detection path (S), the polarization node (P) and the reference path (R) being connected to each other by first capacitive means (CA1), the polarization node (P) and the detection path (S) being connected to each other by second capacitive means (CA2), addressing means (ICS) for selecting among said plurality of conductors ( . . . , IV, V, VI, . . . , IX, X, XI, . . . ) at least one conductor by connecting it to the detection path (S), means (PUS, PDS) for polarizing the polarization node (P), and a device for detecting and quantifying an unbalance between the reference path (R) and the detection path (S) caused by the polarization of the polarization node (P) and by the tactile approach or presence of the body, in order to detect and locate the tactile approach or presence of the body, wherein said device for detecting and quantifying said unbalance comprises:

comparison means (CC) receiving at respective inputs the reference and detection paths (R, S);

variable transfer capacitance means (CPB) connected to at least one of the reference and detection paths; and a control unit (UC) connected between the comparison means and the variable transfer capacitance means and adapted to vary the variable transfer capacitance of said variable transfer capacitance means as a function of the result (Q) produced by the comparison means up to compensation of the unbalance.

8. System according to claim 6, wherein the touch detection device (TDS) is adapted to perform the following steps:

a) set the polarization node (P) to an established potential (GND) and the reference and detection paths (R, S) to an established potential difference, e.g. zero, between them;

b) apply a polarization (VDD) to the polarization node (P) to change its potential;

c) compare the potentials of the reference and detection paths (R, S) to detect a variation in the difference of these potentials caused by the polarization of the polarization node (P) and by the tactile approach or presence of the body;

d) depending on the comparison result (Q), vary the variable transfer capacitance of said variable transfer capacitance means up to compensation of said variation in the difference of potentials between the reference and detection paths (R, S).

9. System according to claim 2, wherein the touch detection device (TDS) is adapted to perform cycles (A, B, C, D, E), each cycle comprising the steps a) to c) and a step of variation of the variable transfer capacitance, these cycles being performed until said variation in the difference of potentials between the reference and detection paths (R, S) is compensated.

10. System according to claim 2, further comprising means (UC) for applying a zero-resetting command (AZ) to the comparison means so as to calibrate the comparison means prior to the step b).

11. System according to claim 5, further comprising means (UC) for applying a zero-resetting command (AZ) to the comparison means so as to calibrate the comparison means during each cycle, prior to the step b).

12. System according to claim 1, wherein the control unit (UC) is adapted to control the touch detection device so as to accomplish several touch detections according to several configurations of conductors selected among the plurality of conductors of the surface and to combine them by summing, subtraction, weighting, linear combination or other arithmetic operations.

13. System for detecting and locating a tactile approach or the presence of a body close to a surface (PAD, TCH) comprising at least one series of conductors (II, III, IV, V, VI, VII and VIII, IX, X, XI, XII) arranged in at least one plane, wherein the surface comprising such a plurality of conductors is associated with a touch detection device (TDS) comprising:

a first polarization path (P+), a second polarization path (P−), a reference path (R) and a detection path (S), selecting means for operating the touch detection device according to a first mode in which the second polarization path (P−) is connected to an established potential (GND), or according to a second mode in which the reference path (R) is connected to an established potential (GND), addressing means (ISX) for selecting among said plurality of conductors ( . . . , IV, V, VI, . . . , IX, X, XI, . . . ), in the first mode, at least one first conductor (V) by connecting it to the first polarization path (P+), at least one second conductor (IV) by connecting it to the reference path (R) and at least one third conductor (VI) by connecting it to the detection path (S) and, in the second mode, at least one first conductor by connecting it to the first polarization path (P+), at least one second conductor by connecting it to the second polarization path (P−) and at least one third conductor by connecting it to the detection path (S), means (PUS1, PDS1, PUS2, PDS2) for polarizing the first polarization path (P+) in the first mode, and the first and second polarization paths (P+, P−) in the second mode, a device for detecting and quantifying an unbalance between the reference path (R) and the detection path (S) caused by the polarization of the first polarization path (P+) or of the first and second polarization paths (P+, P−), and by the tactile approach or presence of the body, in order to detect and locate the tactile approach or presence of the body, wherein said device for detecting and quantifying said unbalance comprises:

comparison means (CMP) receiving at respective inputs the reference and detection paths (R, S);

variable transfer capacitance means (CPD) connected to at least one of the reference and detection paths (R, S) in the first mode, and between one or each of the polarization paths (P+, P−) and the detection path (S) in the second mode; and a control unit (UC) connected between the comparison means and the variable transfer capacitance means and adapted to vary the variable transfer capacitance of said variable transfer capacitance means as a function of the result (Q) produced by the comparison means up to compensation of the unbalance.

14. System according to claim 13, wherein the variable transfer capacitance means of the detection and quantification device comprise at least one set of capacitors (CT1, CT2, ... ) connected to the first and second polarization paths (P+, P−), to the reference path (R) and to the detection path (S) via switches (IR1, IR2, ... , IS1, IS2, ... , IP1+, IP2+, ... , IP1−, IP2−, ... ).

15. System according to claim 13, wherein the touch detection device further comprises first switchable capacitive means (CCO1) between the first polarization path (P+) and the reference path (R), and second switchable capacitive means (CCO2) between the first polarization path (P+) and the detection path (S), wherein in the first and second modes the first capacitive means (CCO1) do not connect the first polarization path (P+) to the reference path (R) and the second switchable capacitive means (CCO2) do not connect the first polarization path (P+) to the detection path (S), wherein the touch detection device may operate according to a third mode that can be selected by said selecting means, and wherein in this third mode the first capacitive means (CCO1) connect the first polarization path (P+) to the reference path (R), the second switchable capacitive means (CCO2) connect the first polarization path (P+) to the detection path (S) and the addressing means select at least one first conductor by connecting it to the detection path (S).

16. System according to claim 15, wherein in the third mode the addressing means select at least one first conductor by connecting it to the detection path (S) and at least one second conductor by connecting it to the reference path (R).

17. System according to claim 1, wherein the conductors are arranged according to a regular pattern.

18. System according to claim 1, wherein the result (Q) produced by the comparison means is in the form of a bit.

19. System according to claim 1, wherein the control unit is adapted to vary the variable transfer capacitance by successive approximations up to bounding of a point of neutralization of the unbalance.

20. System according to claim 1, wherein the variable transfer capacitance means (CPB; CPC) are controlled by a digital command (BLC; BCC) produced by the control unit (UC), this digital command (BLC) being increased or decreased by the control unit (UC) as a function of the result produced by the comparison means (CMP) up to compensation of the unbalance.

21. System according to claim 1, wherein the variable transfer capacitance means comprise a capacitive circuit (CPB) having a variable capacitance.

22. System according to claim 21, wherein the variable capacitance circuit (CPB) comprises at least one set (CRB, CSB) of switchable capacitors in parallel (CS0, CS1, CS2, CR0, CR1, CR2).

23. System according to claim 1, wherein the variable transfer capacitance means comprise a variable voltage gain circuit (AMP, Z1, Z2) and a capacitor (Cr).

24. System according to claim 7, wherein the touch detection device (TDS) is adapted to perform the following steps:
   a) set the polarization node (P) to an established potential (GND) and the reference and detection paths (R, S) to an established potential difference, e.g. zero, between them;
   b) apply a polarization (VDD) to the polarization node (P) to change its potential;
   c) compare the potentials of the reference and detection paths (R, S) to detect a variation in the difference of these potentials caused by the polarization of the polarization node (P) and by the tactile approach or presence of the body;
   d) depending on the comparison result (Q), vary the variable transfer capacitance of said variable transfer capacitance means up to compensation of said variation in the difference of potentials between the reference and detection paths (R, S).

25. System according to claim 8, wherein the touch detection device (TDS) is adapted to perform cycles (A, B, C, D, E), each cycle comprising the steps a) to c) and a step of variation of the variable transfer capacitance, these cycles being performed until said variation in the difference of potentials between the reference and detection paths (R, S) is compensated.

\* \* \* \* \*

UNITED STATES PATENT AND TRADEMARK OFFICE
CERTIFICATE OF CORRECTION

PATENT NO. : 8,471,570 B2  Page 1 of 1
APPLICATION NO. : 12/863173
DATED : June 25, 2013
INVENTOR(S) : Lionel Portmann It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 336 days.

Signed and Sealed this
Eighth Day of September, 2015

Michelle K. Lee
*Director of the United States Patent and Trademark Office*